(12) United States Patent
Murakami

(10) Patent No.: US 8,374,420 B2
(45) Date of Patent: Feb. 12, 2013

(54) LEARNING DEVICE AND LEARNING METHOD FOR ARTICLE TRANSPORT FACILITY

(75) Inventor: Ryuya Murakami, Moriyama (JP)

(73) Assignee: Daifuku Co., Ltd., Osaka (JP)

( * ) Notice: Subject to any disclaimer, the term of this patent is extended or adjusted under 35 U.S.C. 154(b) by 131 days.

(21) Appl. No.: 13/054,304

(22) PCT Filed: Jun. 30, 2009

(86) PCT No.: PCT/JP2009/061928
§ 371 (c)(1),
(2), (4) Date: Apr. 1, 2011

(87) PCT Pub. No.: WO2010/010795
PCT Pub. Date: Jan. 28, 2010

(65) Prior Publication Data
US 2011/0262004 A1    Oct. 27, 2011

(30) Foreign Application Priority Data

Jul. 23, 2008  (JP) ................................. 2008-190014
Jul. 23, 2008  (JP) ................................. 2008-190015

(51) Int. Cl.
*G06K 9/00* (2006.01)
(52) U.S. Cl. ........ 382/153; 382/106; 382/141; 382/275; 382/287; 382/291; 700/213; 700/231; 700/245; 700/258; 700/264; 212/71; 198/339.1; 198/346.3; 198/463.1
(58) Field of Classification Search .................. None
See application file for complete search history.

(56) References Cited

U.S. PATENT DOCUMENTS

| | | | | |
|---|---|---|---|---|
| 6,802,413 B2 * | 10/2004 | Ito | ............................... | 198/465.1 |
| 7,219,769 B2 * | 5/2007 | Yamanouchi et al. | ......... | 187/227 |
| 7,558,645 B2 * | 7/2009 | Shiwaku et al. | ............... | 700/245 |
| 8,027,515 B2 * | 9/2011 | Lee et al. | ....................... | 382/103 |
| 2003/0075415 A1 * | 4/2003 | Ito | ............................... | 198/346.3 |
| 2004/0083025 A1 * | 4/2004 | Yamanouchi et al. | ......... | 700/213 |
| 2008/0044262 A1 * | 2/2008 | Kim et al. | ..................... | 414/273 |
| 2008/0101892 A1 * | 5/2008 | Bonora et al. | ................ | 414/217 |

FOREIGN PATENT DOCUMENTS

| | | |
|---|---|---|
| JP | 10152289 A | 6/1998 |
| JP | 200016756 A | 1/2000 |
| JP | 2003192269 A | 7/2003 |
| JP | 2005170544 A | 6/2005 |

* cited by examiner

*Primary Examiner* — Matthew Bella
*Assistant Examiner* — Jason Heidemann
(74) *Attorney, Agent, or Firm* — The Webb Law Firm

(57) ABSTRACT

A learning control device performs a positioning process, a first image capturing process, and a first deviation amount calculating process in which a reference position deviation amount in the horizontal direction between the imaging reference position and a detection mark is derived based on image information captured in the first image capturing process to derive a position adjustment amount from the derived reference position deviation amount, and the learning control device further includes a positioning correcting process in which the position adjustment device is operated to adjust a position of the second learn assist member based on the derived movement adjustment amount when the reference position deviation amount derived in the first deviation amount calculating process falls outside a set tolerance range. A second image capturing process, and a second deviation amount calculating process may be further provided.

12 Claims, 11 Drawing Sheets

Fig.11
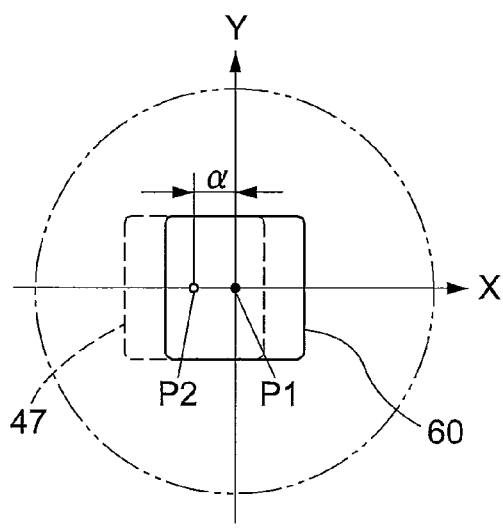
(a)
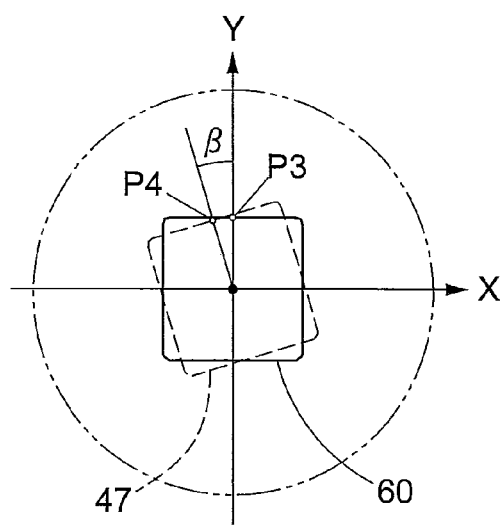
(b)
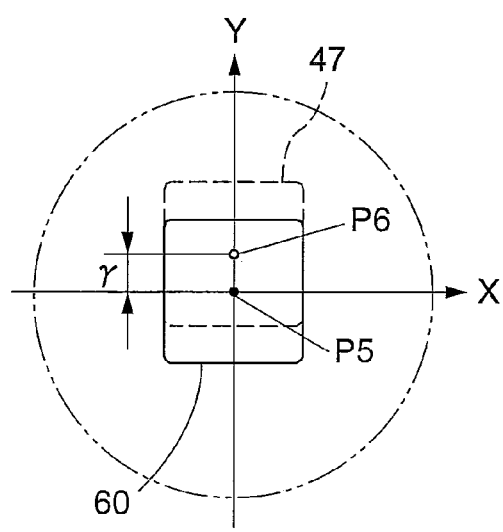
(c)
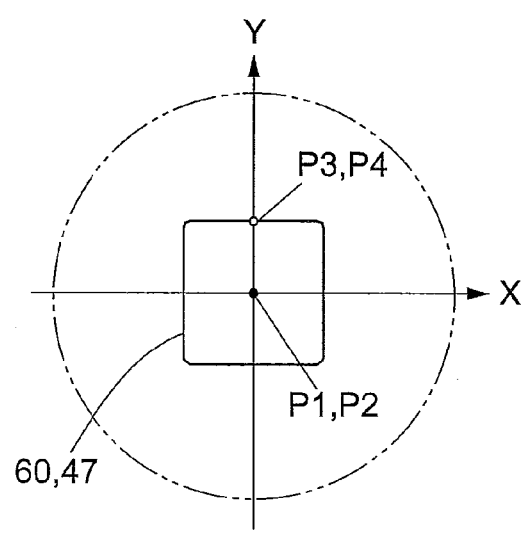
(d)

LEARNING DEVICE AND LEARNING METHOD FOR ARTICLE TRANSPORT FACILITY

BACKGROUND OF THE INVENTION

1. Field of the Invention

The present invention relates to a learning device and a learning method for an article transport facility comprising a vehicle configured to move along a travel path, and having a grip portion for gripping an article with the article suspended therefrom, vertical movement means for raising and lowering the grip portion with respect to the vehicle, position adjustment means for adjusting a position of the grip portion horizontally with respect to the vehicle, wherein articles are transferred to and from a transfer support portion located below the travel path by raising and lowering the grip portion with the vehicle stopped at a target stop position in the travel path.

2. Description of the Related Art

In article transport facilities such as one described above, a plurality of transfer support portions are provided along the travel path and the facilities are configured to transport articles among the plurality of the transfer support portions. And when transferring articles to or from each transfer support portion, the grip portion is raised and lowered with respect to the transfer support portion with the vehicle stopped at a target stop position in a travel path. However, when the grip portion is simply raised and lowered with respect to the transfer support portion, the grip portion may become horizontally displaced from the position it is expected to be, due, for example, to inaccuracies in the installation position of the transfer support portion or due to the swaying motion during the raising and lowering of the grip portion. Thus, it is necessary to learn the amount of position adjustment in the horizontal direction for each transfer support portion when raising and lowering the grip portion with respect to the transfer support portion with the vehicle stopped at the target stop position. The learning device and the learning method for the article transport facility in accordance with the present invention are provided to learn such position adjustment amount. And when actually transferring articles to or from each transfer support portion, the position of the grip portion in the horizontal direction is adjusted using the learned position adjustment amount.

A learning device in a conventional article transport facility is provided with a first learn assist member that can be attached to a transfer support portion and that has a detection mark for indicating the position corresponding to the target transfer reference position in the horizontal direction for the transfer support portion with the first learn assist member attached to the transfer support portion, a second learn assist member that the grip portion can grip and that has an imaging means that can capture an image of the area below the grip portion to capture an image of the detection mark with the second learn assist member gripped by the grip portion, and a learning control means—that controls moving operations of the vehicle, vertical movement operations of the vertical movement means, and imaging operations of the imaging means—for learning the amount of position adjustment in the horizontal direction when raising and lowering the grip portion with respect to the transfer support portion with the vehicle stopped at the target stop position for the transfer support portion. And the learning control means moves the vehicle to the target stop position with respect to the transfer support portion, and performs a positioning process in which the grip portion is raised and lowered such that the second learn assist member gripped by the grip portion, with the second learn assist member adjusted to the standard adjustment position, is located at a target height with respect to the first learn assist member attached to the transfer support portion. The standard adjustment position is, for example, a position in which the center of the grip portion coincides with the center of the vehicle in the lateral direction of the vehicle, and in which the lateral direction and the fore and aft direction of the grip portion coincide with the lateral direction and the fore and aft direction of the vehicle in the angular direction about a vertical axis. After the positioning process, the learning control means is configured to perform an image capturing process in which the imaging means is caused to capture an image of the detection mark, and to perform a deviation amount calculating process in which a reference position deviation amount in the horizontal direction between the imaging reference position set in the center of the field of view of the image and the detection mark is derived based on the image information captured in the image capturing process to calculate the position adjustment amount from the derived reference position deviation amount. (See, for example, Patent Document 1.)

Patent Document 1: Japanese Patent Application Publication No. 2003-192269

SUMMARY OF THE INVENTION

Problems to be Solved by the Invention

In the learning device in the conventional article transport facility described above, the learning control means derives the reference position deviation amount in the horizontal direction between the imaging reference position and the detection mark based on the image information in the deviation amount calculating process. However, when a camera with a convex lens is used as the imaging means, for example, there will be a difference between the actual reference position deviation amount and the reference position deviation amount derived from the image information when the detection mark is located in an edge area in the filed of view of the image. Therefore, there is a possibility that the reference position deviation amount can not be derived accurately. And since the amount of position adjustment is derived from the derived reference position deviation amount, it may also become impossible to accurately derive the position adjustment amount.

The present invention is made in light of this point; and, one of the objects of the invention is to provide a learning device and a learning method for an article transport facility which allows for an accurate learning of the amount of position adjustments by accurately deriving the reference position deviation amount in the horizontal direction between the imaging reference position and the detection mark.

Means for Solving the Problems

In order to attain this object, the learning device for an article transport facility in accordance with the present invention comprises a vehicle configured to move along a travel path, and having a grip portion for gripping an article with the article suspended therefrom, vertical movement means for raising and lowering the grip portion with respect to the vehicle, position adjustment means for adjusting a position of the grip portion horizontally with respect to the vehicle, wherein articles are transferred to and from a transfer support portion located below the travel path by raising and lowering the grip portion with the vehicle stopped at a target stop position in the travel path characterized by a first learn assist member configured to be attached to the transfer support portion and having a detection mark for indicating a position corresponding to a target transfer reference position in a horizontal direction for the transfer support portion with the first learn assist member attached to the transfer support portion; a second learn assist member configured to be gripped by the grip portion and having an imaging means for capturing an image of an area below the grip portion to capture an image of the detection mark with the grip portion gripping the second learn assist member; learning control means for controlling a travel operation of the vehicle, a vertical movement operation of the vertical movement means, an adjusting operation of the position adjustment means, and an imaging operation of the imaging means, and for learning a position adjustment amount in the horizontal direction when raising and lowering the grip portion with respect to the transfer support portion with the vehicle stopped at the target stop position with respect to the transfer support portion; the learning control means is configured to perform: a positioning process in which the grip portion is raised or lowered to position the second learn assist member gripped by the grip portion at the target height with respect to the first learn assist member attached to the transfer support portion, with the vehicle moved to the target stop position for the transfer support portion, and with the grip portion adjusted to a standard adjustment position by the position adjustment means; a first image capturing process in which the imaging means is caused to capture an image of the detection mark after performing the positioning process; a first deviation amount calculating process in which a reference position deviation amount in the horizontal direction between the imaging reference position defined in a center of field of view and the detection mark is derived based on image information captured in the first image capturing process to derive a position adjustment amount from the derived reference position deviation amount, and a positioning correcting process in which the position adjustment means is operated to adjust a position of the second learn assist member based on the movement adjustment amount derived based on the image information captured in the first image capturing process, if the reference position deviation amount derived in the first deviation amount calculating process falls outside a set tolerance range; a second image capturing process in which the imaging means is caused to capture an image of the detection mark after performing the positioning correcting process; and a second deviation amount calculating process in which a reference position deviation amount in the horizontal direction between the imaging reference position defined in a center of field of view and the detection mark is derived based on image information captured in the second image capturing process to derive a position adjustment amount from the derived reference position deviation amount and the movement adjustment amount.

With the configuration described above, if the reference position deviation amount, derived based on the image information captured in the first image capturing process, falls within the set tolerance range—as the result of the learning control means performing the positioning process, the first image capturing process, and the first deviation amount calculating process—the detection mark is determined to be located in the center area of the field of view of the image. Then the reference position deviation amount can be derived accurately based on the image information captured in the first image capturing process, and the position adjustment amount can be accurately derived from the derived reference position deviation amount.

On the other hand, it can be determined that the detection mark is located in an edge area of field of view of the image if the reference position deviation amount derived based on the image information captured in the first image capturing process falls outside the set tolerance range. Therefore, the learning control means can position the detection mark in the center of the field of view of the image by performing the positioning correcting process, and by adjusting the position of the second learn assist member based on the movement adjustment amount derived based on the image information captured in the first image capturing process. And having performed the positioning correcting process, and by performing a second image capturing process and a second deviation amount calculating process, the learning control means can derive the reference position deviation amount accurately based on the image information captured in the second image capturing process, and can derive the position adjustment amount accurately by taking into consideration or by adding not only the reference position deviation amount but also the movement adjustment amount.

As described above, a learning device for an article transport facility is provided, which can accurately derive the reference position deviation amount in the horizontal direction between the imaging reference position and the detection mark to accurately learn position adjustment amount.

In an embodiment of the present invention, the learning control means is preferably configured to derive the reference position deviation amount derived in the first deviation amount calculating process as the movement adjustment amount in the positioning correcting process.

With this configuration, by the positioning correcting process performed by the learning control means, the position of the second learn assist member is adjusted by the reference position deviation amount derived in the first deviation amount calculating process. If the reference position deviation amount derived in the first deviation amount calculating process falls outside the set tolerance range, the detection mark is displaced toward an edge of the field of view of the image from the imaging reference position defined in the center of field of view of the image by the reference position deviation amount derived in the first deviation amount calculating process. Therefore, by adjusting the position of the second learn assist member by the reference position deviation amount derived in the first deviation amount calculating process, the position of the detection mark can be adjusted by the amount corresponding to the amount by which the detection mark is displaced from the imaging reference position toward the edge of the field of view. As a result, the position of the detection mark can be adjusted accurately, and the detection mark can be reliably located in the center of the field of view of the image.

In an embodiment of the present invention, when the reference position deviation amount derived in the second deviation amount calculating process falls outside the set tolerance range, the learning control means is preferably configured to perform again the positioning correcting process, the second image capturing process, and the second deviation amount calculating process, and to determine that an abnormal condition has occurred if a number of times the second deviation amount calculating process has been performed exceeds a permitted number.

With this configuration, the learning control means performs the second deviation amount calculating process not only once, but repeatedly if the reference position deviation amount derived in the second deviation amount calculating process falls outside the set tolerance range; thus, more accurate position adjustment amount can be derived. And the learning control means does not simply repeat the second deviation amount calculating process, but determines that an abnormal condition has occurred in which a repeated execution of the positioning correcting process would not bring the reference position deviation amount to within the set tolerance range if the total number of times the process has been executed becomes greater than the permitted number. The learning control means does not perform the learning process for the position adjustment amount in the abnormal condition; thus, an accurate position adjustment amount can be derived without performing unnecessary calculations.

In the embodiment of the present invention, the position adjustment means is preferably configured to adjust a position of the grip portion horizontally in a lateral direction of the vehicle and to rotate the grip portion about a vertical axis with respect to the vehicle, and the learning control means is preferably configured to derive a lateral width deviation amount in the lateral direction of the vehicle between the detection mark and the imaging reference position, and a rotation deviation amount in the direction of rotation about a vertical axis between the detection mark and the imaging reference position as the reference position deviation amount in the first deviation amount calculating process and the second deviation amount calculating process.

With this configuration, the learning control means can derive the lateral width deviation amount and rotation deviation amount, which can be adjusted by the position adjustment means, as the reference position deviation amount, in the first deviation amount calculating process and the second deviation amount calculating process. Thus, the learning control means can learn the position adjustment amount in the lateral direction of the vehicle and the position adjustment amount about a vertical axis as the position adjustment amount. Therefore, when actually transferring articles to or from the transfer support portions, the position of the grip portion in the lateral direction of the vehicle and about the vertical axis can be adjusted by the position adjustment means based on the learned position adjustment amount, thus allowing a proper transfer to be performed. As a result, the learning control means can accurately learn the position adjustment amount for performing proper transfer.

In the embodiment of the present invention, the learning control means is preferably configured to derive a fore and aft deviation amount in the fore and aft direction of the vehicle between the detection mark and the imaging reference position as the reference position deviation amount in the first deviation amount calculating process and the second deviation amount calculating process, and to calculate the position adjustment amount if the derived fore and aft deviation amount is within a set tolerance range, and to determine that an abnormal condition has occurred if the derived fore and aft deviation amount falls outside the set tolerance range.

With this configuration, since the learning control means calculates the position adjustment amount on the condition that the derived fore and aft deviation amount is within the set tolerance range, the position adjustment amount can be derived without the grip portion displaced with respect to the target transfer reference position in the fore and aft direction of the vehicle; thus, an accurate position adjustment amount can be derived. If the grip portion is displaced with respect to the target transfer reference position in the fore and aft direction of the vehicle, for example, due to the fact that the target stop position is displaced from the correct target stop portion, the fore and aft deviation amount, which the learning control means derived in the first deviation amount calculating process and the second deviation amount calculating process, falls outside the set tolerance range, triggering an abnormal condition. Since an abnormal condition occurs when there is a displacement in the fore and aft direction of the vehicle which cannot be adjusted by the position adjustment means, corrective action such as correcting the target stop position to the correct target stop position etc. can be taken; thus, an suitable action can be taken to eliminate the deviation in the fore and aft direction of the vehicle.

In the embodiment of the present invention, the learning control means is preferably configured to cause the imaging means to capture image of the detection mark a plurality of times in the first image capturing process and the second image capturing process, and to derive unit image deviation amount data which show the amount of deviation in the horizontal direction between the detection mark and the imaging reference position in each of the plurality of images in the first deviation amount calculating process and the second deviation amount calculating process, and to extract data that fall within an effective measurement range by removing data for which the deviation amount falls outside the effective measurement range among the plurality of unit image deviation amount data, and to average the plurality of unit image deviation amount data to derive the reference position deviation amount if a number of extracted unit image deviation amount data is greater than a set number.

With this configuration, the learning control means does not simply derive the reference position deviation amount from the captured image information but instead removes unsuitable data, that is outside the effective measurement range, and such as one in which the detection mark was not captured in the image because, for example, of the swaying of the grip portion, from a plurality of obtained unit image deviation amount data, to extract only the data that fall within the proper effective measurement range and that have captured the detection mark, after which, the learning control means derives the reference position deviation amount by taking an average of the plurality of the extracted unit image deviation amount data; therefore, an accurate position deviation amount can be derived. And, because the learning control means derives the reference position deviation amount by taking an average of the plurality of unit image deviation amount data on the condition that the number of extracted unit image deviation amount data is greater than or equal to a set number, the learning control means determines that an abnormal condition in which an accurate reference position deviation amount can not be derived if the number of extracted unit image deviation amount data is less than the set number, and does not calculate the reference position deviation amount. Thus, an accurate position displacement amount can be derived without performing unnecessary calculations.

In addition, in an article transport facility, the lowering amount for the grip portion from the reference raised position to the target transfer height may be different for each transfer support portion because of the variations, for example, in the installation height of the transfer support portions. Accordingly, it is necessary to learn the target lowering amount for lowering the grip portion from the reference raised position to target transfer height with the vehicle stopped at the target stop position in order to transfer articles properly to and from the transfer support portions.

In a conventional learning device for an article transport facility, a vertical movement amount detection means for detecting an amount of vertical movement of the grip portion with respect to the vehicle is provided and a manual operation is performed to lower the grip portion from the reference raised position to the target transfer height with the vehicle stopped at the target stop position, and the target lowering amount is derived from the detected information from the vertical movement amount detection means at the time of the manual operation.

Because the grip portion is lowered by an manual operation with the learning device for an article transport facility described above, in addition to the cumbersome work necessary to carry out the manual operation of the grip portion, the lowering speed to lower the grip portion tends to be small, which causes it to take a longer time to lower the grip portion from the reference raised position to the target transfer height; thus, it may take longer to learn the target lowering amount.

With the embodiment of the present invention, manually operated command means and vertical movement amount detection means for detecting an amount of vertical movement of the grip portion with respect to the vehicle are preferably provided wherein the learning control means is configured to learn a target lowering amount when lowering the grip portion from a reference raised position to the target transfer height with respect to the transfer support portion with the vehicle stopped at the target stop position for the transfer support portion and when a learning mode is ordered by the manually operated command means with the second learn assist member gripped by the grip portion, the learning control means is configured to perform a lowering process in which an operation of the vehicle is controlled to stop the vehicle at the target stop position and in which an operation of the vertical movement means is controlled to lower the grip portion at a set lowering speed, and to perform a lowering amount calculating process in which a target lowering amount is derived, based on detected information form the vertical movement amount detection means at a time when contact detection means provided to a bottom of the second learn assist member detects that the bottom of the second learn assist member contacted the transfer support portion during the lowering process, and wherein the command means is configured to switch between a command state in which an increased-speed lowering command is issued to the learning control means to lower the grip portion at an increased lowering speed which is greater than the set lowering speed and a non-command state in which the increased-speed lowering command is not issued, and wherein the learning control means is configured to control an operation of the vertical movement to lower the grip portion at the increased lowering speed if the increased-speed lowering command is issued by the command means when the lowering process is being performed.

With this configuration, since the learning control means performs the lowering process and the lowering amount calculating process when the learning mode is ordered by the manually operated command means, the operator simply orders an learning mode to the learning control means by means of the command means to cause the target lowering amount to be learned. In addition, the learning control means controls the operation of the vertical movement means to lower the grip portion at an increased lowering speed which is greater than the set lowering speed if the increased-speed lowering command is issued by the command means during an execution of the lowering process. Therefore, the grip portion can be lowered at a greater lowering speed to shorten the time to lower the grip portion from the reference raised position to the target transfer height with a simple operation by the operator of issuing the increased-speed lowering command by means of the command means. As described above, the learning device for an article transport facility is provided in which the time required for the work to learn the target lowering amount can be shortened while simplifying work.

In the embodiment of the present invention, the learning control means is preferably configured to determine that an abnormal condition has occurred if the increased-speed lowering command has been issued by the command means when the contact detection means detects that the bottom of the second learn assist member has made a contact.

When the vehicle actually transfers an article to or from a transfer support portion, it lowers the grip portion from the reference raised position to the target transfer height where the grip portion is lowered at a smaller speed when the grip portion reaches the target transfer height in order to prevent damage to the article by the collision with the transfer support portion. Accordingly, by lowering the grip portion at a smaller speed when the grip portion reaches the target transfer height when learning the target lowering amount, the target lowering amount can be derived in the same condition as in an actual transfer; thus, an accurate target lowering amount can be learned. To this end, in the configuration described above, if the increased-speed lowering command has been issued by the command means when the contact detection means detects that the bottom of the learn assist member made the contact, the learning control means determines that the lowering speed of the grip portion is too great, and that an abnormal condition has occurred. And by setting the set lowering speed to a speed suitable for an actual transfer, the learning control means determines that the lowering speed of the grip portion is in line with a speed suitable for an actual transfer if the increased-speed lowering command has not been issued by the command means when the contact detection means detects that the bottom of the learn assist member made the contact, thus, can learn an accurate target lowering amount.

In an embodiment of the present invention, the command means is preferably configured to switch to the command state by a manual operation of the operator for switching from the non-command state to the command state, and to return to the non-command state by a release of the manual operation for switching from the non-command state to the command state.

With this configuration, the command means remains in the non-command state if there is no manual operation by the operator, and is switched to the command state only when the manual operation is performed by the operator. Accordingly, the lowering speed, when lowering the grip portion, is basically the set lowering speed, and is an increased-speed lowering speed only when there is a manual operation by the operator. Therefore, an accidental lowering of the grip portion at an increased lowering speed can be prevented.

In an embodiment of the present invention, the learning control means is preferably configured to perform a grip portion raising process in which an operation of the vertical movement means is controlled to raise the grip portion at a set raising speed which is greater than the set lowering speed when raising the grip portion to the vehicle stopped at the target stop position.

With this configuration, the grip portion is raised to the vehicle stopped at the target stop position after deriving the target lowering amount with the learning control means. The learning control means performs the grip portion raising process at that time. This allows the grip portion to be raised quickly, shortening the time required for learning the target lowering amount.

The learning method for the article transport facility which has steps corresponding to these configurations has the advantages that correspond to the configurations described above.

BRIEF DESCRIPTION OF THE DRAWINGS

FIG. 11 shows the relationship between the detection mark and the field of view of the image of the camera.

DETAILED DESCRIPTION OF THE INVENTION

The learning device for article transport facilities in accordance with the present invention is described with reference to the drawings. Since the present invention is directed to a learning device for an article transport facility, the article transport facility is described first.

Figure 1:
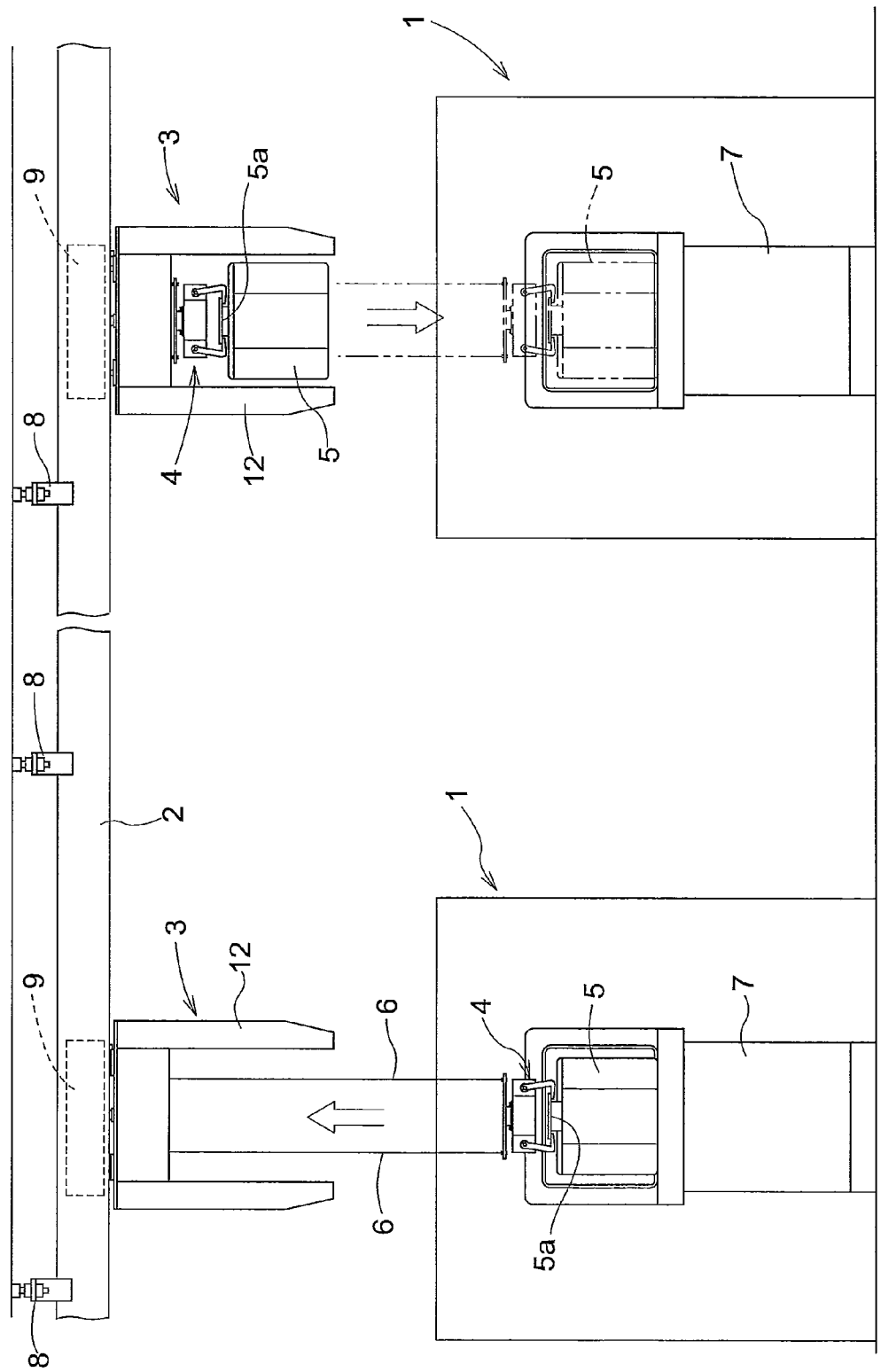
FIG. 1 is a side view of an article transport facility.

This article transport facility is provided, for example, in a clean room with a down-flow type clean air ventilation means which causes the clean air to flow from the ceiling side to the lower side. As shown in FIG. 1, the article transport facility is provided with one or more guide rails 2 (which corresponds to travel paths) that extend along a plurality of article processors 1, and one or more vehicles 3 which can move along with the guide rail or rails 2. Each vehicle 3 is configured to transport a container 5 (which corresponds to an article), which contains semiconductor substrates, among the plurality of article processors 1. The article processors 1 are configured to perform predetermined operations on the work-in-process parts during the manufacturing of the semiconductor substrates, etc.

The vehicle 3 includes a vertically movable grip portion 4 for gripping the container 5 with the container suspended from the grip portion. The grip portion 4 is provided such that it can be raised and lowered between the reference raised position adjacent the vehicle 3 and the target transfer height for transferring articles to or from an article transfer station 7 (which corresponds to the transfer support portion) installed at a lower level than the vehicle 3, by winding and feeding out the wires 6 with the vehicle 3 stopped. Incidentally, FIG. 1 shows when the grip portion 4 is lowered to the target transfer height from the reference raised position as indicated by the downward-pointing arrow, and also when the grip portion 4 is raised from the target transfer height to the reference raised position as indicated by the upward-pointing arrow.

Each station 7 consists of a support platform provided on the floor for supporting the container 5. The station 7 is configured to support a container 5 with the container 5 properly positioned by the engagement of grooves provided to the bottom of the container 5 with the engaging pins P (not shown in FIG. 1) provided to the support platform. The stations 7 are provided for the purpose of receiving containers 5, to which predetermined operations are to be performed by the article processors 1, from the vehicle(s) 3 or of delivering the containers 5, to which the predetermined operations have been performed by the article processors 1, to the vehicle(s) 3, and are located in correspondence with the plurality of article processors 1.

The vehicle 3 is configured to move along the guide rail 2 with the grip portion 4 located in the reference raised position, and to deliver the container 5 to and receive a container 5 from a station 7 by raising and lowering the grip portion 4 between the reference raised position and the target transfer height with the vehicle stopped at the target stop position corresponding to the station 7 to which the article is to be transferred among the plurality of stations 7. The guide rail 2 is fixedly installed in the ceiling with the guide rail brackets 8.

Figure 2:
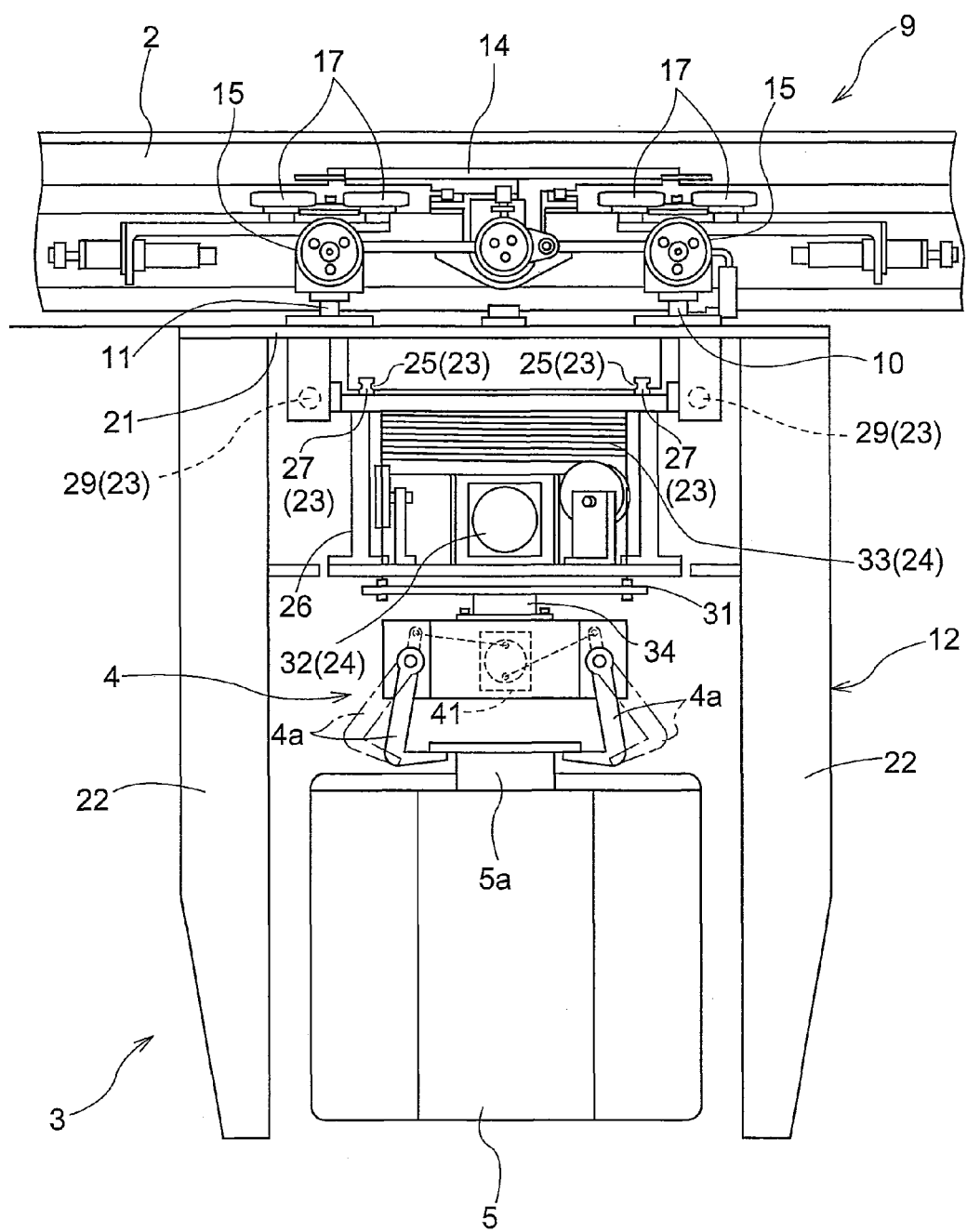
FIG. 2 is a side view of the vehicle.
Figure 3:
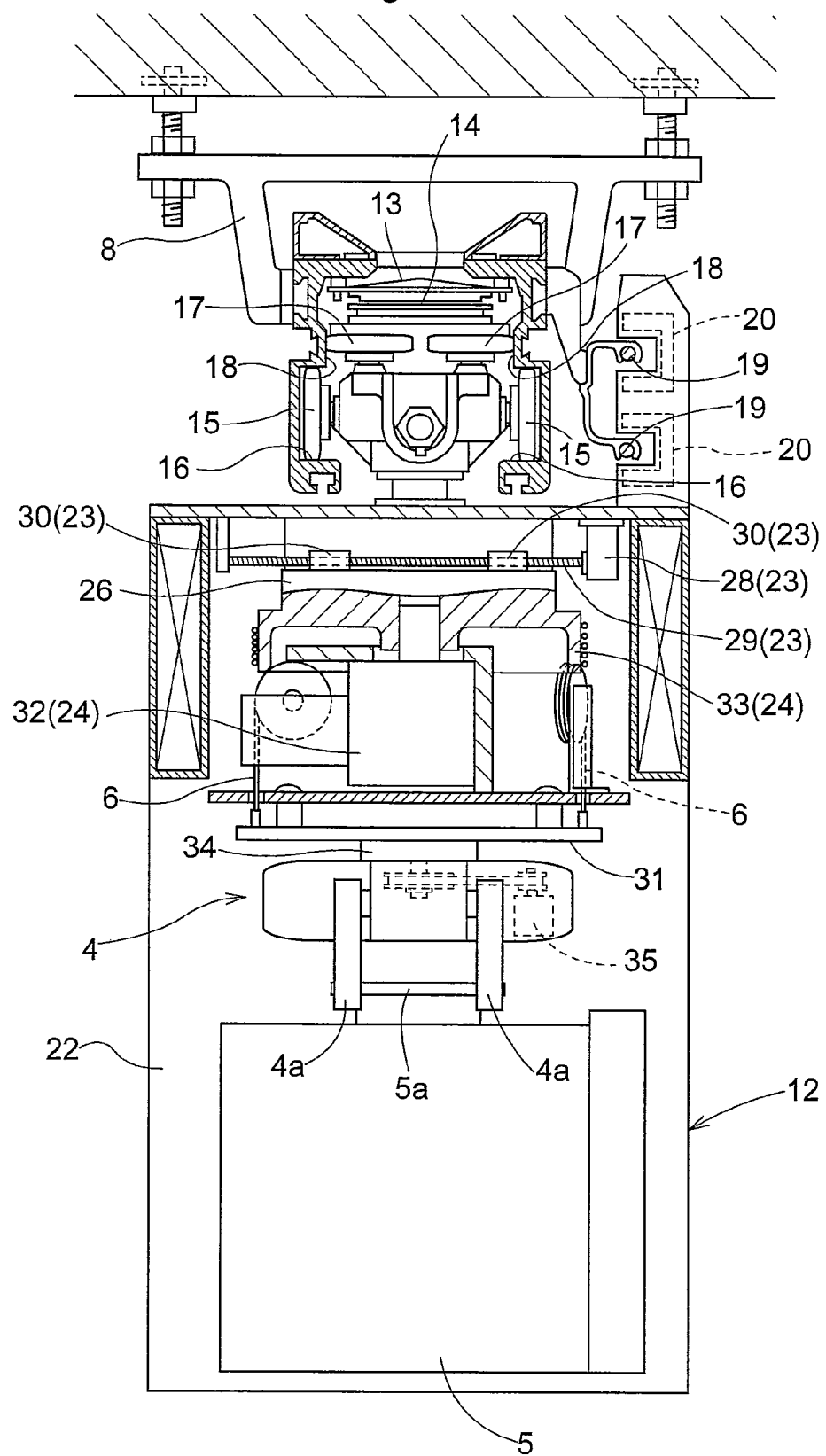
FIG. 3 is a vertical sectional front view of the vehicle.

As shown in FIGS. 2 and 3, the vehicle 3 has an upper vehicle body 9 located within the interior space of the guide rail 2, and a lower vehicle body 12 located below the guide rail 2 with the upper and lower vehicle bodies connected by the front and back connecting shafts 10, 11.

The upper vehicle body 9 has a primary coil 14 such that the primary coil 14 is adjacent and faces the magnet 13 provided in the interior space of the guide rail 2. The upper vehicle body 9 is a linear motor type which obtains the propelling force from the linear motor which consists of the magnet 13 and the primary coil 14; and the vehicle 3 is configured to move along the guide rail 2 by this propelling force. Travel guide surfaces 16 for the travel wheels 15 provided to the upper vehicle body 9, and sway prevention guide surfaces 18 for the sway prevention wheels 17 provided to the upper vehicle body 9 are formed in the interior space of the guide rail 2.

Electricity supply lines 19 are provided in the guide rail 2, and power receiving coils 20 are provided in the upper vehicle body 9. And alternating current is supplied to the electricity supply lines 19 to cause them to generate magnetic fields, which causes the power receiving coil 20 to generate the required electric power for the vehicle 3; thus, the electric power is supplied in a contactless manner.

While the linear motor drive in which the propelling force is obtained by the linear motor is used as an example for the method to propel the upper vehicle body 9 in the present embodiment, another method may also be used in which, for example, an electric motor for rotating the travel wheels 15 is provided and the travel wheels 15 are rotated by this electric motor to propel the upper vehicle body 9.

The lower vehicle body 12 consists of a fore-and-aft frame 21 extending in the fore and aft direction of the vehicle 3, and a pair of front and back vertical frames 22 extending downwardly from the front end location and back end location respectively of the fore-and-aft frame 21. The lower vehicle body 12 is formed to have the shape of a bracket that opens downwardly in a side view, and the grip portion 4 is located in the central part in the fore and aft direction.

Provided under the fore-and-aft frame 21 are, from top to bottom, a slide movement mechanism 23 (which corresponds to the position adjustment means), a vertical movement mechanism 24 (which corresponds to the vertical movement means), and the grip portion 4 in that order. The vertical movement mechanism 24 and the grip portion 4 are supported by the slide movement mechanism 23 such that they can slide and move in the lateral direction of the vehicle 3 with respect to the fore-and-aft frame 21. The grip portion 4 is supported by the vertical movement mechanism 24 so as to be capable of vertically moving with respect to the fore-and-aft frame 21.

The slide movement mechanism 23 has back and front pair of concave guide rails 25 which are fixed to the fore-and-aft frame 21 and which extend in the lateral direction of the vehicle 3, back and front pair of convex guide bodies 27 which are fixed to the vertical movement support 26 which supports the vertical movement mechanism 24, and which engage the concave guide rails 25, as well as a slide driving motor 28, a ball screw 29, and the connecting members 30 for moving the guide bodies 27 along the guide rails 25. The slide movement mechanism 23 moves the connecting member 30, which connects the ball screw 29 with the guide body 27, in one direction and the opposite direction along the lateral direction of the vehicle 3 by drivingly rotating the ball screw 29 with the slide driving motor 28. In this manner, the guide bodies 27 are moved in one or the other direction along the lateral direction of the vehicle 3 with respect to the guide rail 25 to achieve the slide movements of the vertical movement mechanism 24 and the grip portion 4 with respect to the fore-and-aft frame 21 in the lateral direction of the vehicle 3.

The vertical movement mechanism 24 includes the vertically movable body 31 to which the grip portion 4 is fixedly supported, a vertical movement driving motor 32 for raising and lowering the vertically movable body 31 with respect to the vertical movement support 26, a rotation drum 33, and the wires 6. The vertical movement mechanism 24 is configured to raise and lower the vertically movable body 31 while maintaining its approximately horizontal attitude by rotating the rotation drum 33 in one direction and in the opposite direction with the vertical movement driving motor 32 to wind and feed out the four wires 6 simultaneously. The grip portion 4 is raised and lowered with respect to the fore-and-aft frame 21 in this manner.

Although the example described in the present embodiment is one in which wires 6 are wound around the rotation drum 33, for example, belts may be wound around the rotation drum 33 instead to raise and lower the vertically movable body 31. Thus, not only the wires 6 but belts can also be used.

The grip portion 4 is configured to be capable of being rotated about a vertical axis by the pivot shaft 34 with respect to the vertically movable body 31. A rotating driving motor 35 (which corresponds to the position adjustment means) for rotating the pivot shaft 34 about the vertical axis is provided, and the grip portion 4 is rotated about the vertical axis with respect to the fore-and-aft frame 21 by rotating the pivot shaft 34 about the vertical axis with this rotating driving motor 35.

A pair of grippers 4a for gripping the flange 5a of the container 5 is provided to the grip portion 4. And the pair of grippers 4a are configured to switch between a gripping attitude in which the grippers are pivoted toward each other to grip the flange 5a, and a release attitude in which the pair of grippers 4a are pivoted away from each other to release the grip by a rotation of the gripper motor 41 in one direction and reverse direction.

Figure 4:
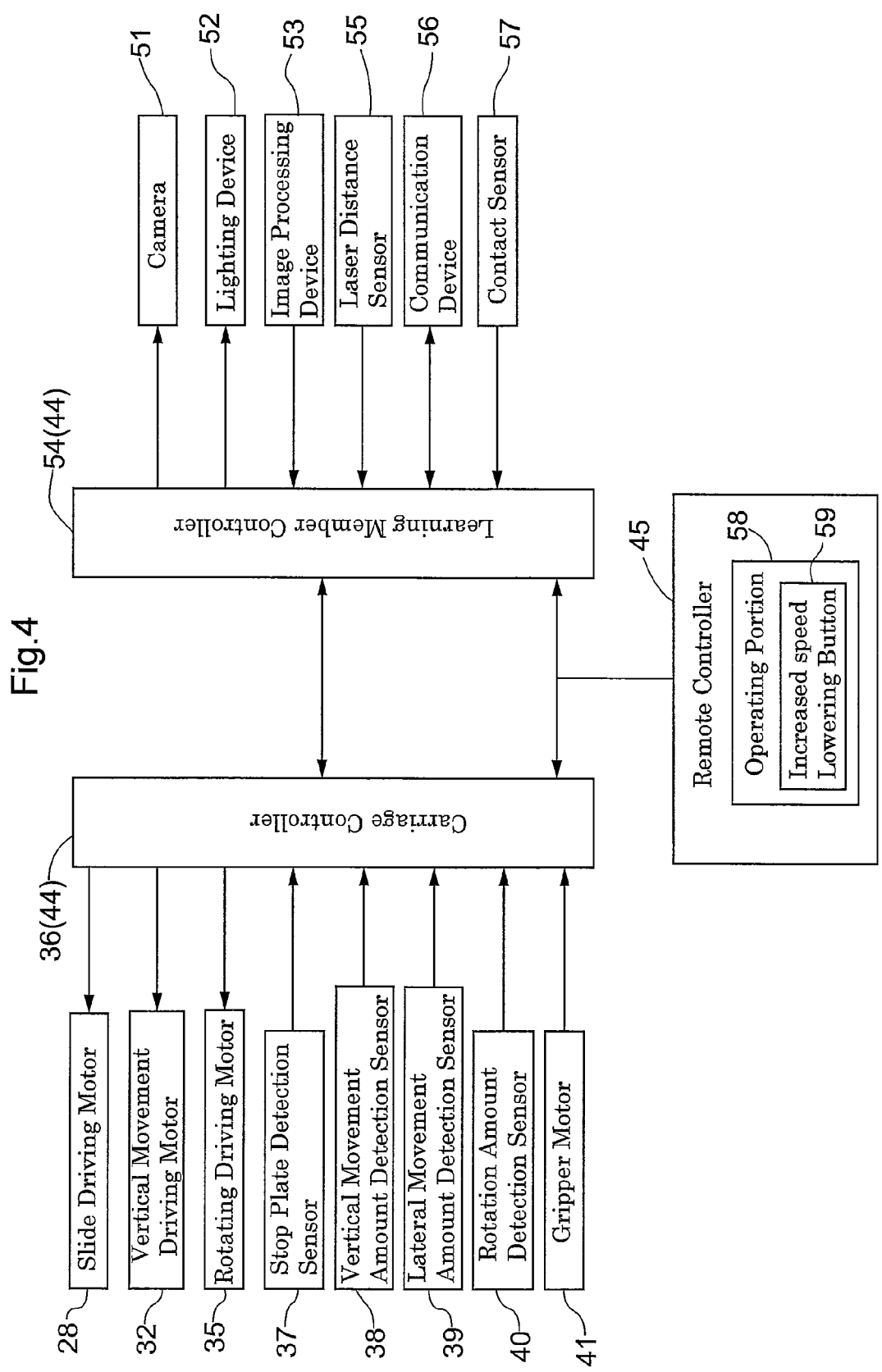
FIG. 4 is a control block diagram of the learning device for the article transport facility.

As shown in FIG. 4, the carriage controller 36 which controls the travel operation of the vehicle 3 etc. is provided in the vehicle 3. The controllers and computers mentioned in the present specification have a CPU, memory, and a communication unit, and store algorithms which execute the functions described in the specification. The carriage controller 36 is configured to control the travel operation of the vehicle 3, the vertical movement operation of the grip portion 4, the position adjustment operation of the grip portion 4 in the lateral direction of the vehicle 3, the rotating operation about the vertical axis of the grip portion 4, and the switching of the grip portion 4 between the gripping attitude and the release attitude, based on commands from the managing computer which manages operations of the overall article transport facility, and on detected information from the various sensors provided to the vehicle 3.

Provided as various sensors are a stop plate detection sensor 37 which detects the stop plates installed, for example, in a side of the guide rail 2, a vertical movement amount detection sensor 38 (which corresponds to the vertical movement detection means) which detects the amount of vertical movement of the grip portion 4 with respect to the reference raised position of the vehicle 3, a lateral movement amount detection sensor 39 which detects the amount of a movement of the grip portion 4 in the lateral direction of the vehicle 3 with respect to the lateral width reference position (for example, middle position) of the vehicle 3, and a rotation amount detection sensor 40 which detects the amount of rotation in the rotational direction of the grip portion 4 about the vertical axis with respect to the standard rotation position (for example, a position in which the lateral direction and the fore and aft direction of the vehicle 3 coincides with the lateral direction and the fore and aft direction of the grip portion 4) of the vehicle 3.

With regard to the stop plates, a target stop position, corresponding to the installation position of each station 7 along the path of the guide rail 2, is defined, and a stop plate is provided at each target stop position. The vertical movement amount detection sensor 38, the lateral movement amount detection sensor 39, and the rotation amount detection sensor 40 consist of a rotary encoder provided, for example, to each of the vertical movement driving motor 32, the slide driving motor 28, and the rotating driving motor 35.

For example, when a transport command, for transporting a container 5 from a station 7 of transport origin to a station 7 of the transport destination, is issued by the managing computer, specifying the station 7 of the transporting origin and the station 7 of the transport destination among the plurality of stations 7, the carriage controller 36 first stops the movement of the vehicle 3 to stop the vehicle 3 at the target stop position of the station 7 of transport origin when the stop plate detection sensor 37 detects the stop plate installed at the target stop position of the station 7 of transport origin. And with the vehicle 3 stopped at the target stop position, the carriage controller 36 controls the operation of the vertical movement driving motor 32 to lower the grip portion 4 from the reference raised position to the target transfer height based on the detected information from the vertical movement amount detection sensor 38. When the grip portion 4 reaches the target transfer height, the carriage controller 36 operates the gripper motor 41 to switch the pair of grippers 4a to the gripping attitude, and causes the flange 5a of the container 5 to be gripped by the pair of grippers 4a to receive the container 5. Thereafter, the carriage controller 36 controls the operation of the vertical movement driving motor 32 to raise the grip portion 4 from the target transfer height to the reference raised position based on the detected information from the vertical movement amount detection sensor 38, then controls the travel operation of the vehicle 3 to move vehicle 3 to the target stop position for the station 7 of the transport destination. The carriage controller 36 is configured to unload the container 5 to the station 7 of the transport destination by controlling the vertical movement operation of the grip portion 4 and the operation of the gripper motor 41 when the vehicle 3 stops at the target stop position for the station 7 of the transport destination, similar to when the container 5 is received from the station 7 of the transport origin.

The carriage controller 36 is configured to perform a transporting process of the container 5 from the station 7 of transport origin to the station 7 of transport destination when a transporting work mode is ordered as described above. The carriage controller 36 has a learning mode in addition to the transporting work mode and is configured to switch to the learning mode to perform a learning process before performing the transporting process in the transporting work mode.

The learning process is structured to learn a target lowering amount when lowering the grip portion 4 from the reference raised position to the target transfer height for the station 7 in order to properly deliver a container 5 and receive a container 5 from each station 7 with the vehicle 3 stopped at the target stop position for the station 7, and to learn a position adjustment amount in the horizontal direction when raising and lowering the grip portion 4 with respect to the station 7 with the vehicle 3 stopped at the target stop position for the station 7.

The learning device for an article transport facility according to the present invention is a device for performing this learning process, and is provided with a first learn assist member 42 (which corresponds to the detected member for learning) which can be attached to a station 7, and a second learn assist member 43 (which corresponds to the learn assist member) that can be gripped by the grip portion 4. And, learning control means 44 is provided for performing the learning process by controlling the travel operation of the vehicle 3 and the vertical movement operation of the grip portion 4, etc., with the first learn assist member 42 attached to the station 7 and with the second learn assist member 43 gripped by the grip portion 4, and a manually operated remote controller 45 (which corresponds to a command means) is provided, which issues a command to the learning control means 44 to operate in the learning mode. This remote controller 45 is a conventional controller, and includes switches, such as the manual operation buttons, a wired- or wireless-communications unit as well as other required circuits; but, it may or may not include a CPU or memory.

Figure 5:
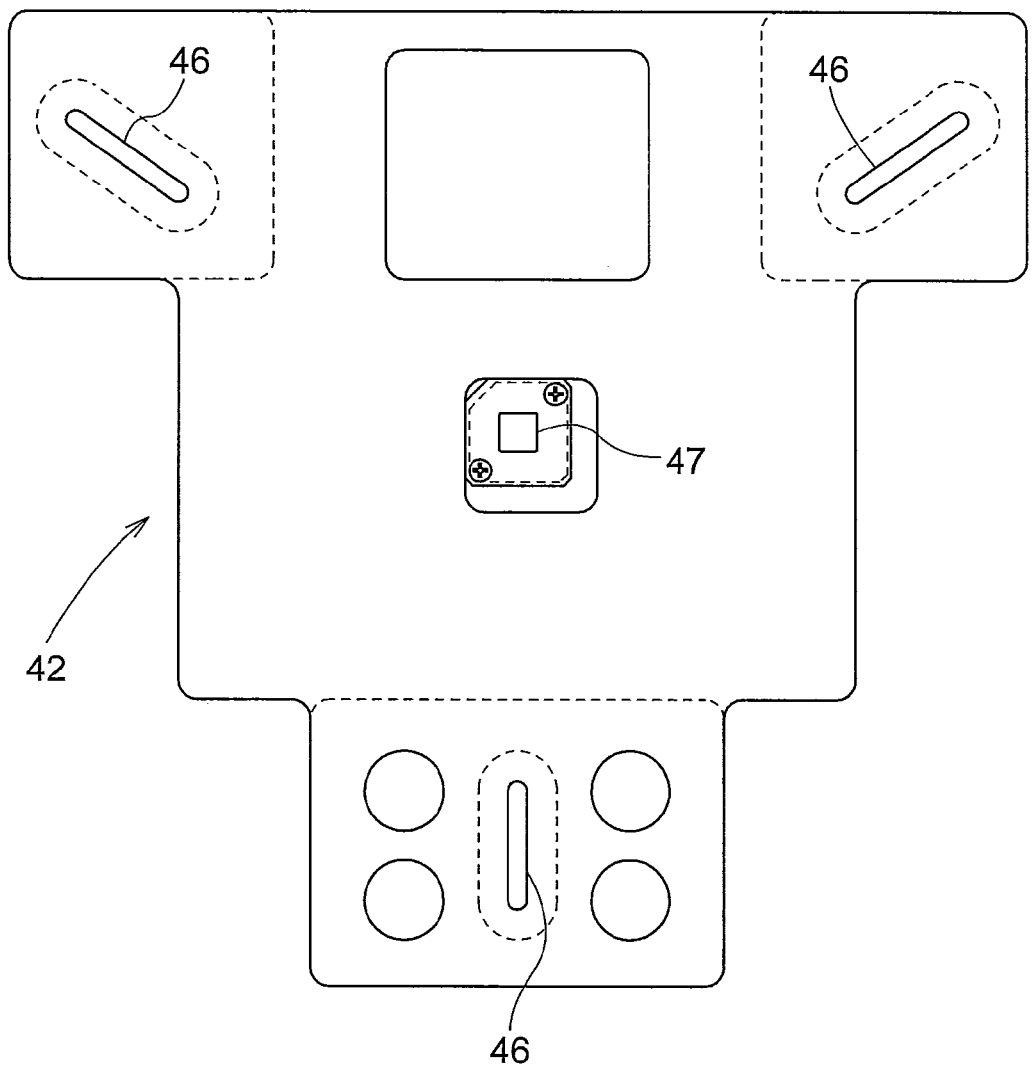
FIG. 5 is a plan view of the first learn assist member.

As shown in FIG. 5, the first learn assist member 42 consists of a plate-shaped body, in which a plurality (three) of the grooves 46 which are elongate holes and each of which engages each engaging pin P provided in the station 7. Thus, the first learn assist member 42 is configured to be attached to and be properly positioned with respect to the station 7. (See FIGS. 9 and 10.) A detection mark 47 which is square in plan view is provided in the middle position on the first learn assist member 42 and the detection mark 47 is adapted to indicate the target transfer reference position when the first learn assist member 42 is attached to the station 7.

Figure 6:
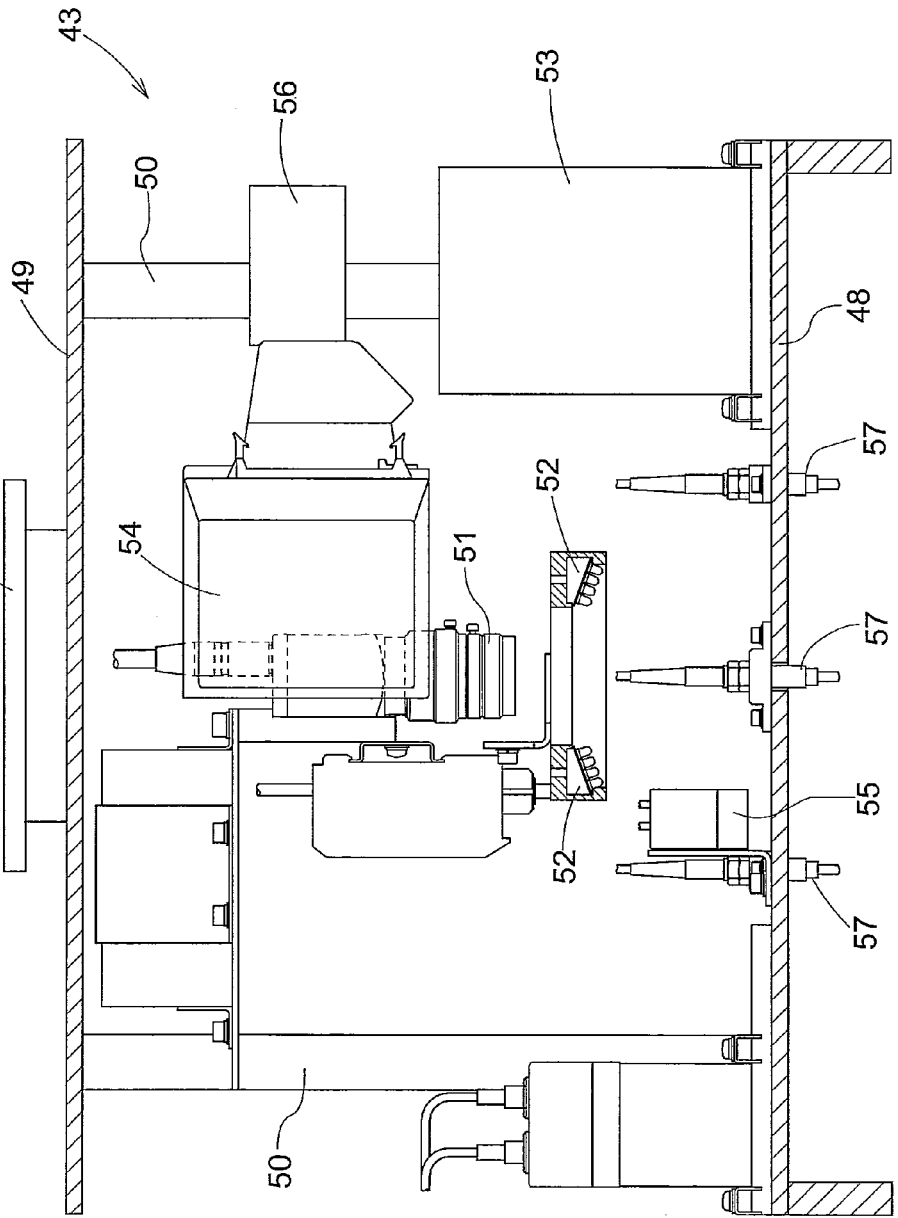
FIG. 6 is a side view of the second learn assist member.
Figure 7:
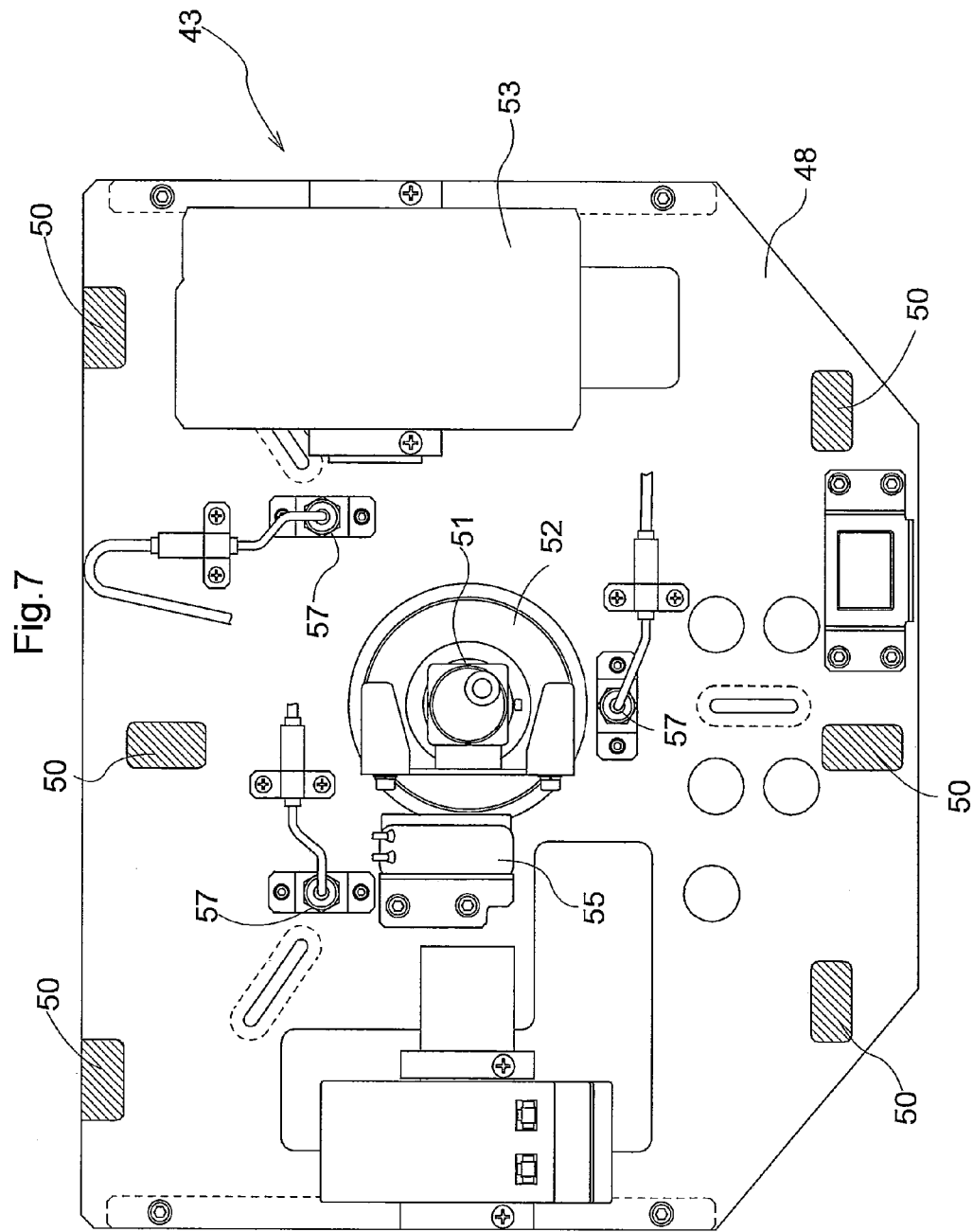
FIG. 7 is a plan view of the second learn assist member.

A shown in FIGS. 6 and 7, the second learn assist member 43 includes a plate-shaped lower frame body 48 and a plate-shaped upper frame body 49, and a plurality of bar-shaped connection frame 50 which connect the lower frame body 48 and the upper frame body 49 with a distance therebetween. It is desirable for the second learn assist member 43 to have the same height and weight as the container 5. The same flange 49a as one of the container 5 is provided in the upper portion of the upper frame body 49, and the grip portion 4 is configured to grip the second learn assist member 43 by gripping the flange 49a with the pair of grippers 4a. Provided in the space between the lower frame body 48 and the upper frame body 49 are a camera 51 (which corresponds to the imaging means) which is located in the central area of the space in plan view and whose imaging direction points downwardly, a lighting device (LED device) 52 which illuminates the field of view of the camera 51, an image-processing device 53 which can output information derived by processing the image captured by the camera 51, a learning member controller 54 which controls the image capturing process, etc. of the camera 51, a laser distance sensor 55 which detects the distance to the object located below by emitting a distance measuring light downward, and a communication device 56 which can communicate wirelessly a variety of information with the carriage controller 36 or the remote controller 45. A conventional camera, such as a CCD camera, can be used as the camera 51. Three contact sensors 57 which detect a contact with an object below are provided to the lower frame body 48 to extend therethrough. The three contact sensors 57 are arranged so that each is located at each corner of a triangle in plan view.

As shown in FIG. 4, the learning member controller 54 is configured to control the operation of the camera 51, the lighting device 52, and the communication device 56, and to receive the information outputted from the image-processing device 53, the detected information from the laser distance sensor 55, and the detected information from the contact sensor 57. And the learning member controller 54 can communicate the detected information from the laser distance sensor 55 or the contact sensor 57 to the carriage controller 36 with the communication device 56, and can receive commands from the carriage controller 36, and also is configured to communicate to the carriage controller 36 the information derived by the image-processing device 53 from the image information captured by the camera 51.

The learning control means 44 is configured to perform the learning process by controlling the travel operation of the vehicle 3, the operation of the vertical movement driving motor 32 which moves the grip portion 4 vertically, the operation of the slide driving motor 28 which makes the position adjustment of the grip portion 4 in the lateral direction of the vehicle 3, the operation of the rotating driving motor 35 which makes the position adjustment of the grip portion 4 in the rotational direction about an vertical axis, and the imaging operation of the camera 51. The learning control means 44 consists of the carriage controller 36 and the learning member controller 54.

The remote controller 45 is configured to issue a command to the learning control means 44 to be in the learning mode when the operator operates the operating portion 58, selecting which stations 7 among a plurality of stations 7 are to be the subject of the learning process, and specifying in which order the learning process would be performed among the selected stations 7. The remote controller 45 is configured, by an operation of an accelerated lowering button 59 in the operating portion 58 by the operator, to switch between a command state in which an accelerated lowering command is issued to the learning control means 44 to lower the grip portion 4 at an increased lowering speed (for example, 6.0 m/min) which is faster than a set lowering speed (for example, 1.2 m/min) and a non-command state in which the accelerated lowering command is not issued. And the remote controller 45 is configured to switch to the command state by a manual operation of the operator to switch from the non-command state to the command state, which is a depression of the increased-speed lowering button 59, and is configured to return to the non-command state by a release of the manual operation. That is, the remote controller 45 is in the command state only while the increased-speed lowering button 59 is being depressed by the operator, and returns to the non-command state if the depressing operation is released.

The learning control means 44 is configured to execute a learning process, with the first learn assist member 42 attached to the station 7 and with the grip portion 4 gripping the second learn assist member 43, by an order to commence the learning mode issued by the remote controller 45.

Figure 8:
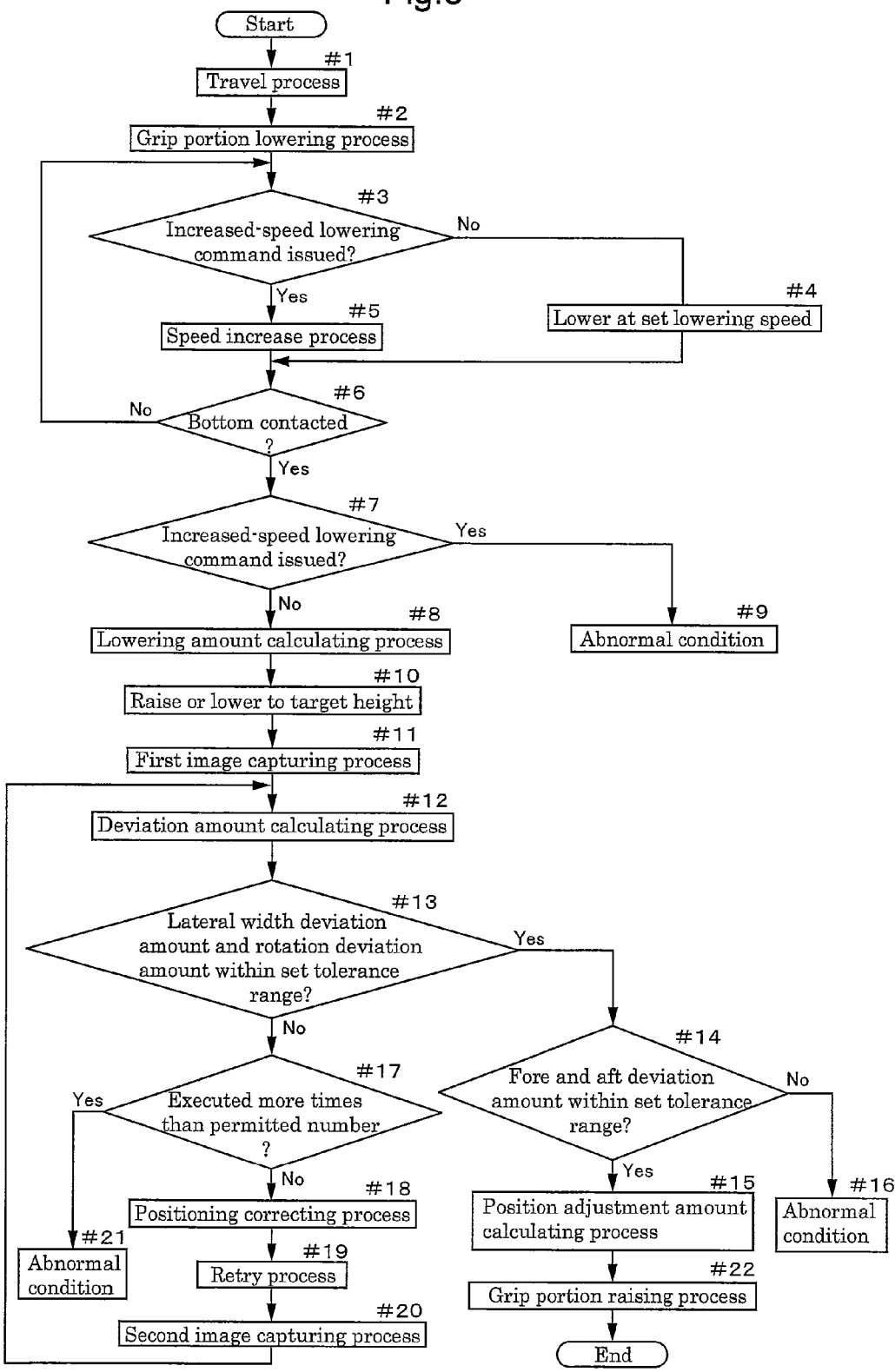
FIG. 8 shows the flow chart for the learning process.

The learning process for one of the stations 7 is described next based on the flow chart shown in FIG. 8. The learning process described below is repeated when performing the learning process for a plurality of stations 7.

Figure 9:
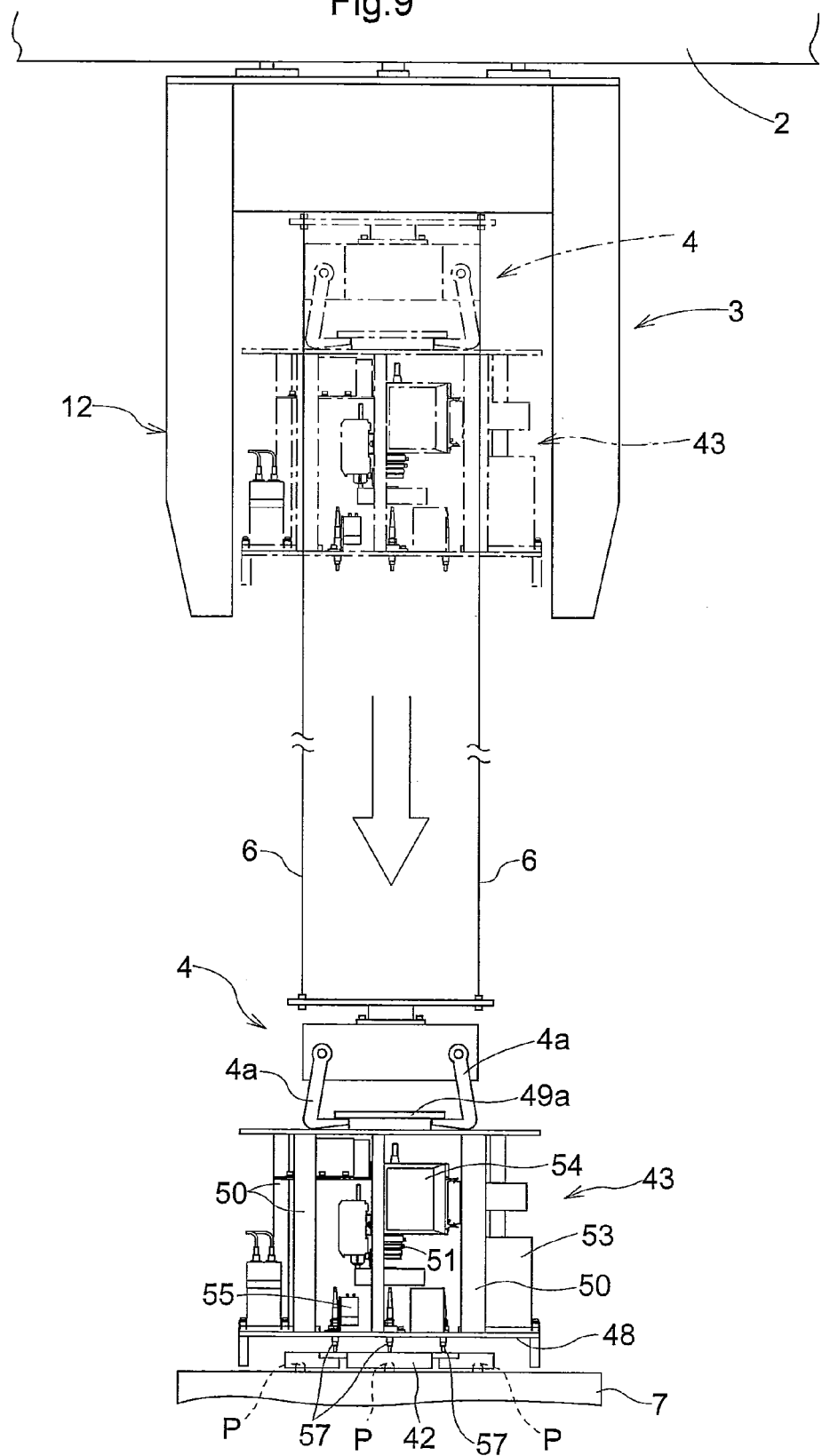
FIG. 9 shows a vertical movement of the grip portion during the learning process.

First, the learning control means 44 performs a travel process (#1) for controlling the travel operation of the vehicle 3 based on the detected information from the stop plate detection sensor 37 to cause the vehicle 3 to travel to the target stop position for the station 7. Next, as shown in FIG. 9, the learning control means 44 performs a grip portion lowering process (#2) for controlling the operation of the vertical movement driving motor 32 to lower the grip portion 4 at a set downward speed with the grip portion 4 adjusted to the standard adjustment position by means of the slide driving motor 28 and the rotating driving motor 35. Thus, the learning control means 44 performs a lowering process by performing the travel process and the grip portion lowering process. Here, the standard adjustment position is, for example, a position in which the center of the grip portion 4 coincides with the center of the vehicle 3 in the lateral direction of the vehicle 3, and in which the lateral direction and the fore and aft direction of the grip portion 4 coincide with the lateral direction and the fore and aft direction of the vehicle 3 in the angular direction about a vertical axis.

The learning control means 44 continues to lower the grip portion 4 at the set lowering speed during the execution of the grip portion lowering process if the increased-speed lowering command has not been issued by the remote controller 45, and performs a speed increase process for controlling the operation of the vertical movement driving motor 32 (#3-#5) to lower the grip portion 4 at an increased lowering speed which is greater than the set lowering speed if the increased-speed lowering command has been issued by the remote controller 45.

Thus, the learning control means 44 controls the operation of the vertical movement driving motor 32 to lower the grip portion 4 at the increased lowering speed which is greater than the set lowering speed if the increased-speed lowering command is issued by the remote controller 45 during an execution of the lowering process. Therefore, the grip portion 4 can be lowered at a greater lowering speed to shorten the time to lower the grip portion with a simple operation by the operator of issuing the increased-speed lowering command by means of the remote controller 45.

Figure 10:
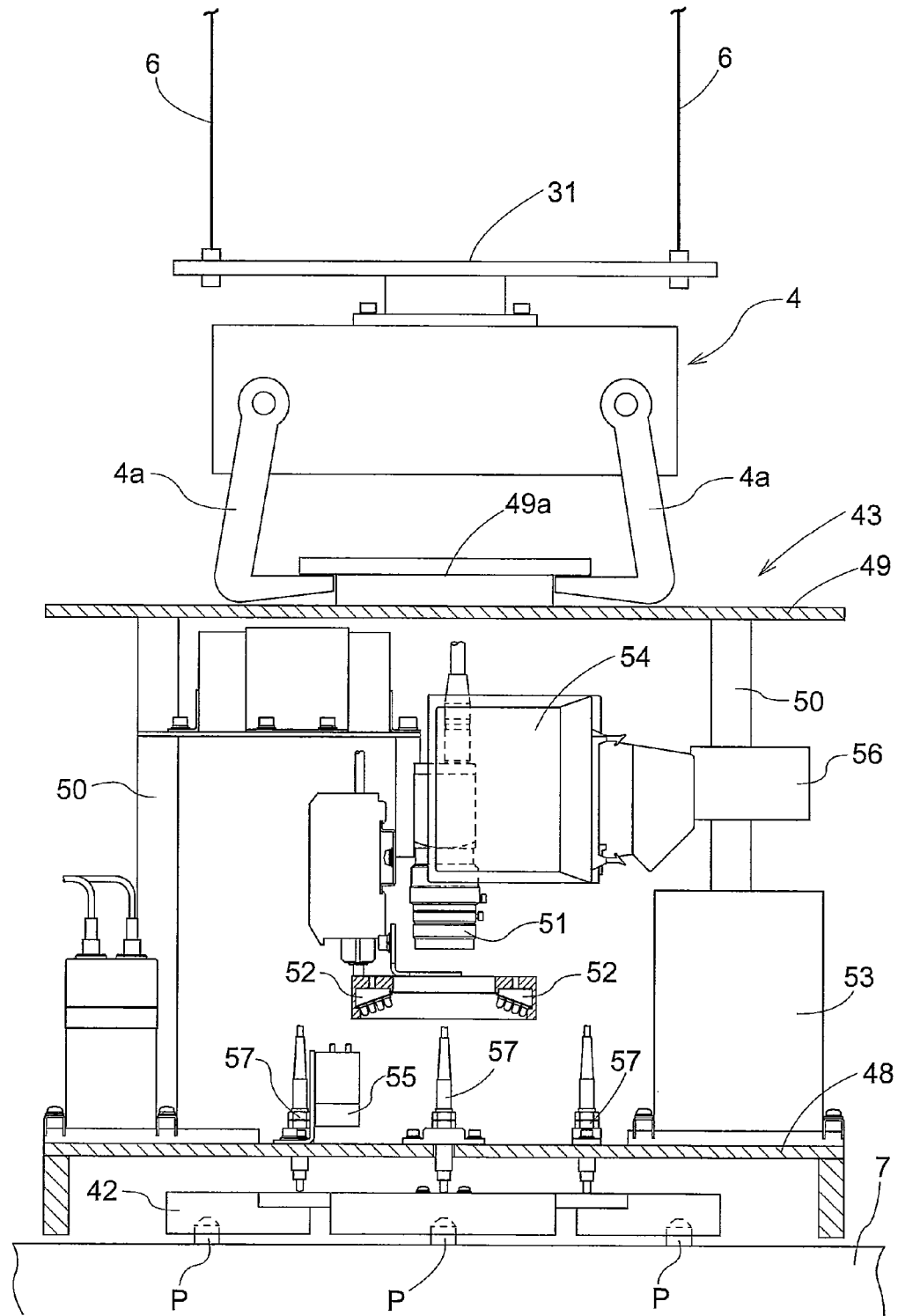
FIG. 10 shows when the second learn assist member contacts the station in the learning process.

As shown in FIG. 10, when the learning control means 44 detects that the bottom of the second learn assist member 43 contacted the upper surface of the first learn assist member 42 on the station 7 by sensing that all of the three contact sensors 57 provided to the second learn assist member 43 contacted the upper surface of the first learn assist member 42, it stops the lowering of the grip portion 4 by the vertical movement driving motor 32, and determines if the increased-speed lowering command has been issued by the remote controller 45 (#6, #7).

If the increased-speed lowering command has not been issued by the remote controller 45 when the learning control means 44 detects that the bottom of the second learn assist member 43 has made contact, the learning control means 44 performs a lowering amount calculating process in which a target lowering amount is derived (#8) based on the detected information from the vertical movement amount detection sensor 38 at that time. Here, with respect to the calculation of target lowering amount, for example, the lowering amount from the reference raised position until it detects the contact of the second learn assist member 43 can be derived as the target lowering amount, or a correction added to that lowering amount can be derived as the target lowering amount.

The three contact sensors 57 are arranged so that each is located at each corner of a triangle in plan view; thus, the three contact sensors 57 are arranged and distributed to be well-balanced in the horizontal direction. Since the contacting of the bottom of the second learn assist member 43 with the upper surface of the first learn assist member 42 of the station 7 is detected only if all of the three contact sensors 57 contact the upper surface of the first learn assist member 42, the contact of the bottom of the second learn assist member 43 can be accurately detected even if the second learn assist member 43 is tilted. Therefore, even if the second learn assist member 43 is tilted, accurate target lowering amount can be derived.

In contrast, if the increased-speed lowering command has been issued by the remote controller 45 when the contact by the second learn assist member 43 is detected, the learning control means 44 performs an abnormal stop of the learning process treating it as an abnormal condition (#9).

The learning control means 44 controls the operation of the vertical movement driving motor 32 based on the detected information from the vertical movement amount detection sensor 38 to raise and lower the grip portion 4 such as to position the second learn assist member 43 at the target height for and with respect to the first learn assist member 42 (#10). At this time, the learning control means 44 checks whether the second learn assist member 43 is located at the target height based on the detected information from the laser distance sensor 55. Here, the target height is determined such that the distance between the camera 51 and the detection mark 47 is the optimal distance for the camera 51 to capture an image of the detection mark 47, and is, for example, where the grip portion 4 is raised by a set height (for example, 3 mM) from the position at which the contact of the bottom of the second learn assist member 43 is detected. In this manner, the learning control means 44 performs a positioning process by performing the travel process and the grip portion lowering process, and by raising and lowering the grip portion 4 such that the second learn assist member 43 is located at the target height.

The learning control means 44 performs a first image capturing process for controlling the image capturing operation of the camera 51 to capture the detection mark 47 with the second learn assist member 43 located at the target height, and performs a deviation amount calculating process in which the reference position deviation amount in the horizontal direction between the imaging reference position defined in the center of field of view of the image and the detection mark 47 is derived based on the image information captured in the first image capturing process (#11, #12). With the second learn assist member 43 located at the target height, the learning control means 44 waits for a set period of time (for example, 10 seconds) so that the swaying of the grip portion 4 is settled down before performing the first image capturing process is performed in order to accurately derive the reference position deviation amount by removing the effect of the swaying of the grip portion 4 as much as possible.

The learning control means 44 derives the reference position deviation amounts based on the image information from the camera 51 in the deviation amount calculating process by means of the image processing device 53. And, as shown in FIG. 11, the learning control means 44 is configured to derive, as the reference position deviation amounts, a lateral width deviation amount $\alpha$ between the detection mark 47 and the imaging reference position in the lateral direction of the vehicle 3 (see FIG. 11(a)), a rotation deviation amount $\beta$ between the detection mark 47 and the imaging reference position in the direction of rotation about an vertical axis (see FIG. 11(b)), and a fore and aft deviation amount $\gamma$ between the detection mark 47 and the imaging reference position in the fore and aft direction of the vehicle 3 (see FIG. 11(c)). In FIG. 11, the X-axis indicates the lateral direction of the vehicle 3, and the Y-axis indicates the fore and aft direction of the vehicle 3. A square standard imaging mark 60 (which corresponds to the imaging reference position) is pre-defined in the center of the field of view of the camera 51, and the standard imaging mark 60 has the same shape and size as the detection mark 47.

The learning control means 44 derives the lateral width deviation amount $\alpha$, rotation deviation amount $\beta$, and fore and aft deviation amount $\gamma$ by comparing the relative position of the standard imaging mark 60 and the detection mark 47. The lateral width deviation amount $\alpha$ can be derived, for example, from the distance in the X direction between the center P1 of the standard imaging mark 60 and the center P2 of the detection mark 47. The rotation deviation amount β can be derived, for example, from the angle in the direction of rotation about the vertical axis between the point P3 on the Y-axis of the standard imaging mark 60 and the point P4 of the detection mark 47 corresponding to P3. The fore and aft deviation amount γ can be derived, for example, from the distance in the Y direction between the center P5 of the standard imaging mark 60 and the center P6 of the detection mark 47.

If the lateral width deviation amount α and rotation deviation amount β which were derived in the deviation amount calculating process are within a set tolerance range (for example, ±0.3 mm for the lateral width deviation amount α, and ±0.3 degrees for the rotation deviation amount β), the learning control means 44 determines whether the fore and aft deviation amount γ is within a set tolerance range (for example, ±5.0 mm), and if the fore and aft deviation amount γ is within a set tolerance range, then the learning control means 44 performs a position adjustment amount calculating process (#13-#15) in which the position adjustment amount is derived from the lateral width deviation amount α and rotation deviation amount β which were derived in the deviation amount calculating process. Here, in the calculation of the position adjustment amount, the lateral width deviation amount α and rotation deviation amount β, which were derived in the deviation amount calculating process, can be used as is, as the position adjustment amounts. Thus, the learning control means 44 performs the first deviation amount calculating process by performing the deviation amount calculating process and the position adjustment amount calculating process.

The learning control means 44 carries out an abnormal stop of the learning operation as an abnormal condition, if the fore and aft deviation amount γ is out of the set tolerance range (#16). When this abnormal condition occurs, the target stop position at which the vehicle 3 stops is determined to have been displaced in the fore and aft direction of the vehicle 3, and the learning operation is performed again after the position of the stop plate has been adjusted.

The learning control means 44 causes the camera 51 to capture the image of the detection mark 47 several times in the first image capturing process. The learning control means 44 controls the operation of the camera 51 to capture the image of the detection mark 47 one hundred times in 10 seconds, for example. In the deviation amount calculating process in the first deviation amount calculating process, the learning control means 44 derives unit image deviation amount data which shows the amount of deviation in the horizontal direction between the detection mark 47 and the imaging reference position for each of the plurality of images (for example, 100), and extracts data in an effective measurement range by removing data for which the deviation amount falls outside the effective measurement range from the plurality of unit image deviation amount data derived. If the number of the extracted unit image deviation amount data is greater than or equal to a set number (for example, 30), the learning control means 44 takes an average of the plurality of the unit image deviation amount data to derive the reference position deviation amount. As the averaging process, the learning control means 44, for example, can derive an average value of the plurality of unit image deviation amount data, and use the average value as the reference position deviation amount.

If the lateral width deviation amount α and rotation deviation amount β which are derived in the deviation amount calculating process fall outside the set tolerance range, and if the number of times the deviation amount calculating process is performed after execution of the positioning correcting process has not reached a permitted number (for example, 4 times), the learning control means 44 performs the positioning correcting process, in which the operations of the slide driving motor 28 and the rotating driving motor 35 are controlled, based on the detected information from the lateral movement amount detection sensor 39 and the rotation amount detection sensor 40(#18) to adjust the position of the second learn assist member 43 based on a movement adjustment amount derived based on the image information captured in the first image capturing process. The learning control means 44 derives the reference position deviation amount derived in the deviation amount calculating process as the movement adjustment amount in the positioning correcting process. That is, the learning control means 44 derives the lateral width deviation amount α and the rotation deviation amount β, which are derived in the deviation amount calculating process, as the movement adjustment amount. For example, when the lateral width deviation amount α and rotation deviation amount fall outside the set tolerance range as shown in FIGS. 11(a) and 11(b), the learning control means 44 adjusts the position of the grip portion 4 in the lateral direction of the vehicle 3 such that the center P1 of the standard imaging mark 60 and the center P2 of the detection mark 47 coincide with each other as shown in FIG. 11(d), and adjusts the position of the grip portion 4 in the direction of rotation about a vertical axis such that the point P3 on the Y-axis of the standard imaging mark 60 and the point P4 of the detection mark 47 coincide with each other.

After raising the grip portion 4 by a set amount (for example, 30 mm), the learning control means 44 lowers the grip portion 4 until the contact by the bottom of the second learn assist member 43 is detected, and performs a retry process in which the operation of the vertical movement driving motor 32 is controlled based on the detected information from the vertical movement amount detection sensor 38 to raise and lower the grip portion 4 in order to position the second learn assist member 43 at the target height (#19). With the second learn assist member 43 located at the target height, the learning control means 44 performs a second image capturing process in which the imaging operation of the camera 51 is controlled to capture the image of the detection mark 47 (#20), and performs again the deviation amount calculating process in which the reference position deviation amount in the horizontal direction between the imaging reference position defined in the center of field of view of the image and the detection mark 47 based on the image information captured in the second image capturing process (#12). With the second learn assist member 43 located at the target height, the learning control means 44 waits for a set period of time (for example, 10 seconds) so that the swaying of the grip portion 4 is settled down before performing the second image capturing process is performed in order to accurately derive the reference position deviation amounts by removing the effect of the swaying of the grip portion 4 as much as possible.

If the lateral width deviation amount α and rotation deviation amount β, which were derived in the repeated deviation amount calculating process, are within the set tolerance range (for example, ±0.3 mm for the lateral width deviation amount α, and ±0.3 degrees for the rotation deviation amount β), the learning control means 44 determines whether the fore and aft deviation amount γ derived in the repeated deviation amount calculation process is within a set tolerance range (for example, ±5.0 mm), and if the fore and aft deviation amount γ is within a set tolerance range, then the learning control means 44 performs a position adjustment amount calculating process (#13-#15) in which the amount of position adjustments is derived from the lateral width deviation amount α and rotation deviation amount β which were derived in the repeated deviation amount calculating process. Here, when calculating the amount of position adjustment, in the lateral direction of the vehicle 3, if the lateral width deviation amount α which is derived in the deviation amount calculating process and the adjustment amount in the movement adjustment amount are in the same direction, the lateral width deviation amount α and the adjustment amount are added to derive the position adjustment amount, and if they are in the opposite directions, the position adjustment amount can be derived from the difference between the lateral width deviation amount α and the adjustment amount. The position adjustment amount for the direction of rotation about the vertical axis can also be derived in a manner similar to one for the lateral direction of the vehicle 3. Thus, the learning control means 44 performs the second deviation amount calculating process by performing the deviation amount calculating process and the position adjustment amount calculating process.

If the reference position deviation amount, derived based on the image information captured in the first image capturing process, falls within the set tolerance range as the result of the learning control means 44 performing the first image capturing process and the first deviation amount calculating process after deriving the target lowering amount, the detection mark 47 is determined to be located in the center of the field of view of the image. Then the reference position deviation amount can be derived accurately based on the image information captured in the first image capturing process, and the position adjustment amount can be accurately derived from the derived reference position deviation amount. On the other hand, if the reference position deviation amount, derived based on the image information captured in the first image capturing process, falls outside the set tolerance range, the detection mark 47 is determined to be located in an edge area of the field of view of the image. The positioning correcting process is performed accordingly and a position adjustment of the second learn assist member is carried out based on the movement adjustment amount derived based on the image information captured in the first image capturing process to position the detection mark 47 in the center of field of view of the image. And having performed the positioning correcting process, and by performing a second image capturing process and a second deviation amount calculating process, the learning control means 44 can accurately derive the reference position deviation amount based on the image information captured in the second image capturing process, and can accurately derive the position adjustment amount by taking into consideration or by adding not only the reference position deviation amount but also the movement adjustment amount.

And, since the learning control means 44 determines whether fore and aft deviation amount γ is within the set tolerance range (for example, ±5.0 mm) in the second deviation amount calculating process after performing the positioning correcting process (#18), even if, for example, the fore and aft deviation amount γ falls outside the set tolerance range (for example, ±5.0 mm) in the first deviation amount calculating process, by performing the positioning correcting process, the fore and aft deviation amount γ may come to be within the set tolerance range (for example, ±5.0 mm) in the second deviation amount calculating process. Therefore, because a deviation in the fore and aft direction of the vehicle 3 can be corrected by an execution of the positioning correcting process, the position adjustment amount can be learned without abnormal conditions occurring unnecessarily.

The learning control means 44 causes the camera 51 to capture the image of the detection mark 47 several times in the second image capturing process. The learning control means 44 controls the operation of the camera 51 to capture the image of the detection mark 47, for example, one hundred times in 10 seconds. In the deviation amount calculating process in the second deviation amount calculating process, the learning control means 44 derives unit image deviation amount data which shows the amount of deviation in the horizontal direction between the detection mark 47 and the imaging reference position for each of the plurality of images (for example, 100), and extracts data in an effective measurement range by removing data for which the deviation amount falls outside an effective measurement range from the plurality of unit image deviation amount data derived. If the number of the extracted unit image deviation amount data is greater than or equal to a set number (for example, 30), the learning control means 44 takes an average of the plurality of the unit image deviation amount data to derive the reference position deviation amount. As the averaging process, the learning control means 44, for example, can derive an average value of the plurality of unit image deviation amount data, and use the average value as the reference position deviation amount.

The learning control means 44 carries out an abnormal stop of the learning operation treating it as an abnormal condition, if the number of times of execution of the deviation amount calculating process executed after execution of the positioning correcting process reaches a permitted number (for example, 4 times) (#21). Thus, if or when the total number of times the second deviation amount calculating process has been executed becomes greater than the permitted number, the learning control means 44 determines that to be an abnormal condition in which repeated execution of the positioning correcting process would not cause the reference position deviation amount to fall within the set tolerance range.

After performing the deviation amount calculating process based on the first image capturing process and the first deviation amount calculating process by execution of the position adjustment amount calculating process, or the deviation amount calculating process based on the second image capturing process and the second deviation amount calculating process by execution of the position adjustment amount calculating process, the learning control means 44 performs a grip portion rising process in which the operation of the vertical movement driving motor 32 is controlled in order to raise the grip portion 4 at a set raising speed which is greater than the set lowering speed (#22).

Thus, in the learning device for an article transport facility according to the present invention, if the reference position deviation amount, derived based on the image information captured in the first image capturing process, falls within the set tolerance range as the result of the learning control means 44 performing the positioning process, the first image capturing process and the first deviation amount calculating process, then the detection mark 47 is determined to be located in the center of the field of view of the image. Then the reference position deviation amount can be derived accurately based on the image information captured in the first image capturing process, and the position adjustment amount can be accurately derived from the derived reference position deviation amount. On the other hand, if the reference position deviation amount, derived based on the image information captured in the first image capturing process, falls outside the set tolerance range, the detection mark 47 is determined to be located in an edge area of the field of view of the image. The positioning correcting process is performed accordingly and a position adjustment of the second learn assist member is carried out based on the movement adjustment amount derived based on the image information captured in the first image capturing process to position the detection mark 47 in the center of field of view of the image. And having performed the positioning correcting process, and by performing a second image capturing process and a second deviation amount calculating process, the learning control means 44 can derive the reference position deviation amount accurately based on the image information captured in the second image capturing process, and can derive the position adjustment amount accurately by taking into consideration or by adding not only the reference position deviation amount but also the movement adjustment amount.

And in the learning method for the article transport facility according to the present invention, with the first learn assist member 42 attached to the station 7, and with the grip portion 4 gripping the second learn assist member 43, with the vehicle 3 stopped at the target stop position, and with the grip portion adjusted to the standard adjustment position by means of the slide driving motor 28 and the rotating driving motor 35, the positioning step is performed in which the grip portion 4 is raised and lowered such that the second learn assist member 43 is located at the target height for the first learn assist member 42. And after the positioning step is performed, a first imaging step is performed in which the camera 51 is caused to capture the image of the detection mark 47, and the reference position deviation amount in the horizontal direction between the imaging reference position and the detection mark 47 is derived based on the image information captured in the first imaging step and a first deviation amount calculating step is performed in which position adjustment amount is derived from the derived reference position deviation amount. And if the reference position deviation amount derived in the first deviation amount calculating step falls outside the set tolerance range, the positioning correcting step is performed, in which the slide driving motor 28 and the rotating driving motor 35 are operated, to adjust the position of the second learn assist member 43 based on the movement adjustment amount derived based on the image information captured in the first imaging step. And after the positioning correcting step is performed, a second imaging step is performed in which the camera 51 is caused to capture the image of the detection mark 47, and the reference position deviation amount in the horizontal direction between the imaging reference position and the detection mark 47 is derived based on the image information captured in the second imaging step and a second deviation amount calculating step is performed in which position adjustment amount is derived from the derived reference position deviation amount and the movement adjustment amount.

Alternative Embodiments (1) Although all of the lateral width deviation amount, rotation deviation amount, and the fore and aft deviation amount are derived as the reference position deviation amount in the embodiment described above, any one of the three, for example, may be derived as the reference position deviation amount. And a horizontal direction along which the reference position deviation amount is derived may be changed as appropriate.

(2) Although the retry process in the embodiment above is performed after performing the positioning correcting process, the positioning correcting process can also be performed as a retry process after the grip portion 4 is raised by the set amount (for example, 30 mm).

(3) In the embodiment described above, the learning control means 44 may, in the positioning correcting process, derive the movement adjustment amount for moving the detection mark 47 to the center of field of view of the image from the reference position deviation amount derived in the first deviation amount calculating process.

(4) Although a station 7 was used as an example of the transfer support portion in the embodiment described above, when article support portions are supported and suspended from the ceiling under a guide rail 8, for example, the article support portions may also be the transfer support portion. Therefore, the transfer support portion only needs to be an object to which the vehicle 3 transfers an article to, and various kinds of article support portions may be used.

The present invention can be used as a learning device and a learning method for an article transport facility used in a clean room, or in other article processing facilities, etc.

The invention claimed is:

1. A learning device for an article transport facility, the learning device comprising: a vehicle configured to move along a travel path, and having a grip portion for gripping an article with the article suspended therefrom, vertical movement means for raising and lowering the grip portion with respect to the vehicle, position adjustment means for adjusting a position of the grip portion horizontally with respect to the vehicle, wherein articles are transferred to and from a transfer support portion located below the travel path by raising and lowering the grip portion with the vehicle stopped at a target stop position in the travel path characterized by a first learn assist member configured to be attached to the transfer support portion and having a detection mark for indicating a position corresponding to a target transfer reference position in a horizontal direction for the transfer support portion with the first learn assist member attached to the transfer support portion;

a second learn assist member configured to be gripped by the grip portion and having an imaging means for capturing an image of an area below the grip portion to capture an image of the detection mark with the grip portion gripping the second learn assist member;

a learning control means for controlling a travel operation of the vehicle, a vertical movement operation of the vertical movement means, an adjusting operation of the position adjustment means, and an imaging operation of the imaging means, and for learning a position adjustment amount in the horizontal direction when raising and lowering the grip portion with respect to the transfer support portion with the vehicle stopped at the target stop position with respect to the transfer support portion;

wherein the learning control means is configured to perform:

a positioning process in which the grip portion is raised or lowered to position the second learn assist member gripped by the grip portion at the target height with respect to the first learn assist member attached to the transfer support portion, with the vehicle moved to the target stop position for the transfer support portion, and with the grip portion adjusted to a standard adjustment position by the position adjustment means;

a first image capturing process in which the imaging means is caused to capture an image of the detection mark after performing the positioning process;

a first deviation amount calculating process in which a reference position deviation amount in the horizontal direction between the imaging reference position defined in a center of field of view and the detection mark is derived based on image information captured in the first image capturing process to derive a position adjustment amount from the derived reference position deviation amount, and a positioning correcting process in which the position adjustment means is operated to adjust a position of the second learn assist member based on the movement adjustment amount derived based on the image information captured in the first image capturing process, if the reference position deviation amount derived in the first deviation amount calculating process falls outside a set tolerance range;

a second image capturing process in which the imaging means is caused to capture an image of the detection mark after performing the positioning correcting process; and a second deviation amount calculating process in which a reference position deviation amount in the horizontal direction between the imaging reference position defined in the center of field of view and the detection mark is derived based on the image information captured in the second image capturing process to derive a position adjustment amount from the derived reference position deviation amount and the movement adjustment amount.

2. The learning device for an article transport facility as defined in claim 1, wherein the learning control means is configured to derive the reference position deviation amount derived in the first deviation amount calculating process as the movement adjustment amount in the positioning correcting process.

3. The learning device for an article transport facility as defined in claim 1, wherein when the reference position deviation amount derived in the second deviation amount calculating process falls outside the set tolerance range, the learning control means is configured to perform again the positioning correcting process, the second image capturing process, and the second deviation amount calculating process, and to determine that an abnormal condition has occurred if a number of times the second deviation amount calculating process has been performed exceeds a permitted number.

4. The learning device for an article transport facility as defined in claim 1, wherein the position adjustment means is configured to adjust a position of the grip portion horizontally in a lateral direction of the vehicle and to rotate the grip portion about a vertical axis with respect to the vehicle, and the learning control means is configured to derive a lateral width deviation amount in the lateral direction of the vehicle between the detection mark and the imaging reference position, and a rotation deviation amount in the direction of rotation about a vertical axis between the detection mark and the imaging reference position as the reference position deviation amount in the first deviation amount calculating process and the second deviation amount calculating process.

5. The learning device for an article transport facility as defined in claim 4, wherein the learning control means is configured to derive a fore and aft deviation amount in the fore and aft direction of the vehicle between the detection mark and the imaging reference position as the reference position deviation amount in the first deviation amount calculating process and the second deviation amount calculating process, and to calculate the position adjustment amount if the derived fore and aft deviation amount is within a set tolerance range, and to determine that an abnormal condition has occurred if the derived fore and aft deviation amount falls outside the set tolerance range.

6. The learning device for an article transport facility as defined in claim 1, wherein the learning control means is configured to cause the imaging means to capture image of the detection mark a plurality of times in the first image capturing process and the second image capturing process, and to derive unit image deviation amount data which show the amount of deviation in the horizontal direction between the detection mark and the imaging reference position in each of the plurality of images in the first deviation amount calculating process and the second deviation amount calculating process, and to extract data that fall within an effective measurement range by removing data for which the deviation amount falls outside the effective measurement range among the plurality of unit image deviation amount data, and to average the plurality of unit image deviation amount data to derive the reference position deviation amount if a number of extracted unit image deviation amount data is greater than or equal to a set number.

7. The learning device for an article transport facility as defined in claim 1, further comprising:

a manually operated command means, and a vertical movement amount detection means for detecting an amount of vertical movement of the grip portion with respect to the vehicle, wherein the learning control means is configured to learn a target lowering amount when lowering the grip portion from a reference raised position to the target transfer height with respect to the transfer support portion with the vehicle stopped at the target stop position for the transfer support portion and when a learning mode is ordered by the manually operated command means with the second learn assist member gripped by the grip portion, the learning control means is configured to perform a lowering process in which an operation of the vehicle is controlled to stop the vehicle at the target stop position and in which an operation of the vertical movement means is controlled to lower the grip portion at a set lowering speed, and to perform a lowering amount calculating process in which a target lowering amount is derived, based on detected information form the vertical movement amount detection means at a time when contact detection means provided to a bottom of the second learn assist member detects that the bottom of the second learn assist member contacted the transfer support portion during the lowering process, and wherein the command means is configured to switch between a command state in which an increased-speed lowering command is issued to the learning control means to lower the grip portion at an increased lowering speed which is greater than the set lowering speed and a non-command state in which the increased-speed lowering command is not issued, and wherein the learning control means is configured to control an operation of the vertical movement to lower the grip portion at the increased lowering speed if the increased-speed lowering command is issued by the command means when the lowering process is being performed.

8. The learning device for an article transport facility as defined in claim 7, wherein the learning control means is configured to determine that an abnormal condition has occurred if the increased-speed lowering command has been issued by the command means when the contact detection means detects that the bottom of the second learn assist member has made a contact.

9. The learning device for an article transport facility as defined in claim 7, wherein the command means is configured to switch to the command state by a manual operation of the operator for switching from the non-command state to the command state, and to return to the non-command state by a release of the manual operation for switching from the non-command state to the command state.

10. The learning device for an article transport facility as defined in claim 7, wherein the learning control means is configured to perform a grip portion raising process in which an operation of the vertical movement means is controlled to raise the grip portion at a set raising speed which is greater than the set lowering speed when raising the grip portion to the vehicle stopped at the target stop position.

11. A learning method for an article transport facility comprising a vehicle configured to move along a travel path, and having a grip portion for gripping an article with the article suspended therefrom; vertical movement means for raising and lowering the grip portion with respect to the vehicle; position adjustment means for adjusting a position of the grip portion horizontally with respect to the vehicle; wherein articles are transferred to and from a transfer support portion located below the travel path by raising and lowering the grip portion with the vehicle stopped at a target stop position in the travel path, the method comprising:

a positioning step for raising and lowering the grip portion to position a second learn assist member at a target height with respect to a first learn assist member attached to the transfer support portion with the first learn assist member attached to the transfer support portion, the first learn assist member having a detection mark for indicating a position corresponding to a target transfer reference position in a horizontal direction for the transfer support portion, with the grip portion gripping the second learn assist member having imaging means for capturing an image of an area below the grip portion to capture an image of the detection mark, with the vehicle stopped at the target stop position, and with a position of the grip portion adjusted to a standard adjustment position by the position adjustment means;

a first image capturing step for causing the imaging means to capture an image of the detection mark after performing the positioning step;

a first deviation amount calculating step for deriving a reference position deviation amount in the horizontal direction between the imaging reference position defined in a center of field of view and the detection mark based on image information captured in the first image capturing step to derive a position adjustment amount in the horizontal direction when raising or lowering the grip portion with respect to the transfer support portion with the vehicle stopped at the target stop position for the transfer support portion from the derived reference position deviation amount, and a positioning correcting step for operating the position adjustment means to adjust a position of the second learn assist member based on the movement adjustment amount derived based on the image information captured in the first image capturing step when the reference position deviation amount derived in the first deviation amount calculating step falls outside a set tolerance range, a second image capturing step for causing the imaging means to capture an image of the detection mark after performing the positioning correcting step;

a second deviation amount calculating step for deriving a reference position deviation amount in the horizontal direction between the imaging reference position defined in a center of field of view and the detection mark based on image information captured in the second image capturing step to derive a position adjustment amount from the derived reference position deviation amount and the movement adjustment amount.

12. The learning method for an article transport facility as defined in claim 11, further comprising: manually operated command means, and vertical movement amount detection means for detecting an amount of vertical movement of the grip portion with respect to the vehicle, wherein when a learning mode is ordered by the manually operated command means with the second learn assist member gripped by the grip portion, a lowering step is performed for controlling an operation of the vehicle to stop the vehicle at the target stop position, and for controlling an operation of the vertical movement means to lower the grip portion at a set lowering speed, and a lowering amount calculating step is performed for deriving a target lowering amount based on detected information form the vertical movement amount detection means at a time when contact detection means provided to a bottom of the second learn assist member detects that the bottom of the second learn assist member contacted the transfer support portion during the lowering step, and wherein the command means is configured to switch between a command state in which an increased-speed lowering command is issued to the learning control means to lower the grip portion at an increased lowering speed which is greater than the set lowering speed and a non-command state in which the increased-speed lowering command is not issued, and wherein an operation of the vertical movement is controlled to lower the grip portion at the increased lowering speed if the increased-speed lowering command is issued by the command means when the lowering step is being performed.

\* \* \* \* \*

UNITED STATES PATENT AND TRADEMARK OFFICE
CERTIFICATE OF CORRECTION

PATENT NO. : 8,374,420 B2
APPLICATION NO. : 13/054304
DATED : February 12, 2013
INVENTOR(S) : Ryuya Murakami It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 200 days.

Signed and Sealed this
First Day of September, 2015

Michelle K. Lee
*Director of the United States Patent and Trademark Office*